United States Patent [19]
Suzuki et al.

[11] Patent Number: 5,192,949
[45] Date of Patent: Mar. 9, 1993

[54] DIGITAL DATA TRANSMISSION SYSTEM HAVING ERROR DETECTING AND CORRECTING FUNCTION

[75] Inventors: Hideto Suzuki; Yoshikazu Kurose; Shinji Aoki, all of Kanagawa, Japan

[73] Assignee: Sony Corporation, Tokyo, Japan

[21] Appl. No.: 575,377

[22] Filed: Aug. 30, 1990

[30] Foreign Application Priority Data

Aug. 31, 1989 [JP] Japan .................................. 1-225855

[51] Int. Cl.$^5$ ............................................. H03M 7/14
[52] U.S. Cl. ...................................... 341/68; 341/58; 371/37.4
[58] Field of Search ................. 341/68, 58, 50, 69-74; 371/37.4

[56] References Cited

U.S. PATENT DOCUMENTS

| | | | |
|---|---|---|---|
| 4,517,552 | 5/1985 | Shirota et al. | 341/58 |
| 4,626,826 | 12/1986 | Fukuda et al. | 341/58 |
| 4,833,471 | 5/1989 | Tokuume et al. | 341/58 |
| 4,885,750 | 12/1989 | Tanaka et al. | 371/37.4 |
| 4,954,826 | 9/1990 | Isozaki et al. | 341/68 |
| 5,042,037 | 8/1991 | Endon | 341/58 |

*Primary Examiner*—Sharon D. Logan
*Attorney, Agent, or Firm*—Alvin Sinderbrand; William S. Frommer

[57] ABSTRACT

In an information data recording and reproducing device which can record and reproduce input information data accurately, an error correction code of the product sign format is added to the input information data to form coded data. The coded data are then NRZI converted and recorded onto a recording medium together with identification data of a predetermined data pattern. Error detecting and correcting are performed on data reproduced from the recording medium so as to obtain the data recorded on the recording medium. The device comprises an NRZI converting circuit for outputting the identification data as they are, that is, without NRZI conversion, and for NRZI converting the coded data using the last bit of the identification data as an initial value, and a memory controlling circuit for controlling writing and reading of a memory, which is provided to convert the reproduction data from a series of inner codes into another series of outer codes, so that write address information for the memory which is obtained from the reproduction data may be compensated for when it is not obtained properly and outer code error detection and correction may be readily executed.

19 Claims, 14 Drawing Sheets

SEC SECTOR (TR RECORD TRACK)

FIG. 13

(A) MEM10

| ADR_ROW | ID_BLK |  |
|---|---|---|
| 00 | FD | □(DT1■) |
| 02 | FF | □(DT3■) |
| 04 | 01 | ■ |
| 06 | 03 | □ |
| 08 | 05 | ■ |
| 0A | 07 | □ |
| ... | ... | ... |
| FA | F7 | □ |
| FC | F9 | □ |
| FE | FB | □ |

(B) MEM20

| ADR_ROW | ID_BLK |  |
|---|---|---|
| 01 | FE | □(DT2■) |
| 03 | 00 | ■ |
| 05 | 02 | □ |
| 07 | 04 | ■ |
| 09 | 06 | ■ |
| 0B | 08 | □ |
| ... | ... | ... |
| FB | F8 | □ |
| FD | FA | □ |
| FF | FC | □ |

DIGITAL DATA TRANSMISSION SYSTEM HAVING ERROR DETECTING AND CORRECTING FUNCTION

BACKGROUND OF THE INVENTION

1. Field of the Invention

This invention relates to a digital data transmission system wherein an error correction code of the product sign format is appended to transmitted data and NRZL-NRZI conversion is performed.

2. Description of the Prior Art

Conventionally, a data recorder conforming to the ANSI ID-1 format (Third Draft PROPOSED AMERICAN NATIONAL STANDARD 19 mm TYPE ID-1 INSTRUMENTATION DIGITAL CASSETTE FORMAT X3B6-88-12 Project 592-D 1988-03-22) is known as a recording and reproducing device which effects high density recording of information data.

In such a data recorder, an error correction code of the product sign format employing a Reed-Solomon code is appended to information data and such information data are recorded on a magnetic tape. Upon reproduction error detection and correction are performed to detect errors encountered in transmission and to correct the same.

Such a data recorder is generally described below.

FIG. 1 illustrates a record pattern which is recorded on a magnetic tape by means of a data recorder conforming to the ID-1 format. The record pattern shown includes a longitudinal annotation track ANN on which annotations are recorded and oblique data tracks TR1, TR2, TR3, . . . on which information data are recorded with one sector formed on each track. Individual data tracks are azimuth recorded in an alternating relationship. The record pattern further includes a control track CTL on which control signals are recorded, and a time code track TC on which time codes are recorded.

Commonly construction of the data tracks TR1, TR2, TR3, . . . is as illustrated in FIG. 2. In particular, each of the data tracks TR corresponds to one sector SEC and consists of a preamble portion PR, a data record portion DT and a postamble portion PS. The preamble portion PR corresponds to a lower side portion of a data track oriented is a slanted inclining relationship on the magnetic tape, as illustrated in FIG. 1

The preamble portion PR consists of a rising sequence RUS having a length of 20 bytes, a synchronization code $SYNC_{PR}$ and sector identification data $ID_{sec1}$ each having a length of 4 bytes, and auxiliary data $DT_{AUX}$ having a length of 6 bytes.

The subsequent data record portion DT, on which information data are recorded, consists of 256 synchronization blocks BLK ($BLK_0$, $BLK_1$, $BLK_2$, . . . and $BLK_{255}$). Each of the synchronization blocks BLK consists of a block synchronization code $SYNC_{BLK}$ having a length of 4 bytes, block identification data $ID_B$ having a length of one byte, inner data (data obtained by inner decoding of input information data which had previously undergone outer decoding) DI having length of 153 bytes, and a parity code RI in the form of a Reed-Solomon code having a length of 8 bytes.

The postamble portion PS of each of the data tracks consists of a synchronization code $SYNC_{PS}$ and sector identification data $ID_{SEC2}$ each having a length of 4 bytes.

FIG. 3 illustrates the recording system of a data recorder conforming to ID-1 format. In the recording system 1, an error correction code of the product sign format is appended to input information data, and the information data thus obtained is recorded onto a magnetic tape.

The operation of individual elements of the recording system 1 is as follows.

First, information data $DT_{use}$ are first provided to an outer code generating circuit 2.

Using a predetermined generating function, the outer code generating circuit 2 generates as outer parity codes $RO_0$ to $RO_{305}$ each consisting of a 10 byte Reed-Solomon code for the individual data blocks of the input information data $DT_{USE}$. The individual data blocks each include 118 bytes. The outer code generating circuit 2 then appends the outer codes to the ends of the individual blocks as shown in FIG. 4 and outputs them as outer data blocks DO. The outer data blocks DO are transmitted to a memory 4 by way of a first multiplexer 3.

Construction of the memory 4 and an array of data in the memory 4 are illustrated in FIG. 5. As shown in FIG. 5, the memory 4 includes two memories MEM1 and MEM2 wherein each row includes 154 bytes and each column includes 128 bytes. Outer data blocks $DO_0$ to $DO_{52}$, that is, 153 blocks successively inputted to the memory written into the memory MEM1 while outer data blocks $DO_{153}$ to $DO_{305}$, that is, the next 153 blocks subsequentially input to the memory 4 are written into the other memory MEM2. The outer data blocks are written in memories MEM1 and MEM2 so that each outer data block occupies one column of memory space. Since the information component of one outer data block consists of 118 bytes and 153 blocks of information data are written into each of the memories MEM1 and MEM2, the memory 4 stores $118 \times 153 \times 2$ bytes, or 36,108 bytes of information data therein.

The order of writing the outer data blocks in each column of the memories MEM1 and MEM2 is indicated by an arrow A in FIG. 5, and each 10 byte outer error code is written last in each column of the memories MEM1 and MEM2.

Data block identification data $ID_B$ which are generated by an identification data generating circuit 5 and serve as data for the identification of each row in the memories MEM1 and MEM2 are also transmitted to the memory 4 by way of the first multiplexer 3. Even-numbered data block identification data $ID_{BE}$ and odd-numbered data block identification $ID_{BO}$ are written in the direction indicated by arrow A into the memories MEM1 and MEM2, respectively.

The data block identification data $ID_B$ serve as identification data for subsequent inner coding of the outer data blocks which is performed on each row of data in the memories MEM1 and MEM2 in contrast to outer coding, which as described above, is executed in accordance with each column of memories MEM1 and MEM2.

Data written in the memories MEM1 and MEM2 are read front each row of the memories in an order indicated by an arrow B in FIG. 5. Reading of the individual rows is executed alternately from the memories MEM1 and MEM2 in an order corresponding to the data block identification data $ID_b$ (00, 01, 02, 03, . . . ).

Data read out from the memories MEM1 and MEM2 are input to an inner code generating circuit 6.

Using a predetermined generating function, the inner code generating circuit 6 generates inner parity codes $RI_0$ to $RI_{255}$ each consisting of an byte Reed-Solomon code for the individual inner data blocks input thereto. The inner code generating circuit 6 appends the inner codes to ends of the individual data blocks and outputs them as inner data blocks $DI_0$ to $DI_{255}$, as shown in FIG. 6, to a second multiplexer 7.

The second multiplexer 7 successively selects and outputs preamble data PR and postamble data PS produced by a preamble portion and postamble portion generating circuit 8, and inner data blocks $DI_0$ to $DI_{255}$ output from the inner code generating circuit 6. The order of the resulting output data is: preamble data PR, inner data block $DI_0$ to $DI_{255}$ and postamble data PS.

The output of the second multiplexer 7 is supplied to a data randomizer 9.

In order to randomize the data, the data randomizer 9 performs an exclusive OR operation between each byte of data input thereto and predetermined data.

Such randomized data are provided to an 8-9 modulating circuit 10.

The 8-9 modulating circuit 10 converts 8-bit data into 9-bit data in order to remove a dc component from a signal to be recorded onto a magnetic tape. The conversion is performed as follows:

In particular, 9-bit data of two kinds are predefined for each of the 256 possible values of 8 bit input data in accordance with the ID-1 format. The two kinds of 9-bit data are such that in CDS (Codeword Digital Sums) thereof are of opposite polarity. The 8-9 modulating circuit 10 monitors the DSV (Digital Sum Variation) of 9-bit data output in response to input data and selects the two kinds of 9-bit data such that the value of the DSV converges to zero. In this memory 8-bit input data are converted into 9-bit dc free data.

It is to be noted that the 8-9 modulating circuit 10 includes a circuit for converting the format of input data of NRZL (Non-Return-to-Zero-Level) into NRZI (Non-Return-to-Zero-Inverse) data.

An output of the 8-9 modulating circuit 10, that is, 9-bit NRZI data is supplied to a third multiplexer 11.

The third multiplexer 11 adds to each of the inner data blocks $DI_0$ to $DI_{255}$ a fixed synchronization code $SYNC_B$ having a length of 4 bytes generated by a synchronization code generating circuit 12 to form a synchronization block $BLK_0$ to $BLK_{255}$. A code pattern of the synchronization code $SYNC_B$ is prescribed by the ID-1 format, and it is also prescribed that a pattern recorded on a magnetic tape must maintain such code pattern.

Data obtained by the processing described above is illustrated in the maps shown in FIG. 7. An output of the third multiplexer 11 provides a data array which is obtained by scanning the maps MAP1 and MAP2 in a horizontal direction. Details of the data array are shown in FIG. 2.

The output of the third multiplexer 11 is supplied to a parallel/serial converting circuit 13.

The parallel/serial converting circuit 13 converts parallel data of the preamble portion PR, synchronization blocks $BLK_0$ to $BLK_{255}$ and postamble portion PS provided thereto into serial data $S_{REC}$.

The serial data $S_{REC}$ are amplified by a recording and amplifying circuit 14 and then supplied as a recording signal to a magnetic head 16 which scans a magnetic tape 15 to record the signal on the magnetic tape 15. Consequently, data tracks TR ( . . . , TR1, TR2, TR3, TR4, . . . ) as shown in FIG. 1 are formed on the magnetic tape 15.

The recording system 1 of the data recorder is structured in this manner such that it adds an error correction code to desired information data $DT_{USE}$ in accordance with the Reed-Solomon product sign format to be record with the information data.

The information data $DT_{USE}$ recorded on the magnetic tape 14 by the recording system 1 of the data recorder in this manner are reproduced by a reproducing system 20 of the data recorder shown in FIG. 8.

The reproducing system 20 executes signal processing that is substantially the reverse of that executed by the recording system 1.

In particular, in the reproducing system 20 of the data recorder, record tracks TR ( . . . , TR1, TR2, TR3, TR4, . . . ) on a magnetic tape 15 are read out as a reproduction signal $S_{PB}$ using a magnetic head 16 and supplied to a reproducing and amplifying circuit 21.

The reproducing and amplifying circuit 21 includes an equalizer and binary digitizing circuit which binary digitizes the reproduction signal $S_{PB}$ input thereto into reproduction digital data $DT_{PB}$ which are provided to a succeeding serial/parallel converting circuit 22.

The serial/parallel converting circuit 22 converts the serial reproduction digital data $DT_{PB}$ into 9-bit parallel data $DT_{PR}$.

A synchronization code detecting circuit 23 detects a synchronization code $SYNC_B$ from the parallel data $DT_{PR}$ and identifies each synchronization block in accordance with such synchronization code $SYNC_B$. The synchronization code detecting circuit 23 includes a circuit for converting parallel data $DT_{PR}$ of the NRZI format into the NRZL format.

An output of the synchronization code detecting circuit 23 is inputted an 8-9 demodulating circuit 24. The 8-9 demodulating circuit 24 demodulates data which have been converted from 8-bit data into 9-bit data for eliminating its DC component and then converts it back into 8-bit data. The 8-9 demodulating circuit 24 includes a ROM (Read Only Memory) and converts data from 9 bits into 8 bits by map retrieval processing.

Data demodulated into 8-bits are derandomized by a derandomizer 25 in a manner that is the inverse of the randomizing executed by the recording system 1. Derandomization is accomplished by performing an exclusive or operation between data input to the derandomizer 25 and the same predetermined data used for the randomizing processing.

An inner code error detecting circuit 26 then executes error detection and correction using 8-byte inner codes $RI_0$ to $RI_{255}$ appended to the individual inner data blocks $DI_0$ to $DI_{255}$ among the identified synchronization blocks.

After inner code error detection and corrections is performed the are written in a memory 28 having the same construction as the memory 4 of the recording system 1 shown in FIG. 5 such that each block of data will fill one row of memory space. Block identification data $ID_B$ appended to individual blocks by identification data generating circuit 5 are detected by an identification data detecting circuit 27. Inner data blocks are written to memory 28 in an order similar to the order of reading inner data blocks from the memory 4 of the recording system 1, and writing is executed for each row alternately into memories MEM1 and MEM2 in accordance with block identification data.

Inner data blocks written to the memories MEM1 and MEM2 of the memory 28 are subsequently read out column by column in the same order as writing outer data blocks to the memory 4 of the recording system 1. As a result, outer data blocks $DO_0$ to $DO_{306}$ having a length of 128 bytes are obtained.

An outer code error detecting and correcting circuit 29 executes error detection and correction in accordance with outer codes $RO_0$ to $RO_{306}$ appended to the individual outer data blocks $DO_0$ to $DO_{306}$ output from the memory 28.

Information data $DT_{USE}$ recorded on the magnetic tape 15 are reproduced in this manner.

A data recorder having the construction described above has problems in actually receiving, recording and reproducing information data. Accordingly, it is difficult to obtain a data recorder with a high degree of accuracy.

The 8-9 modulating circuit used in the recording system 1 of the data recorder described above is disclosed in U.S. Pat. No. 4,520,346 and is generally constituted as shown in FIG. 9.

In particular, in the 8-9 modulating circuit 10, input data $DT_{NRZL}$ in the form of an NRZL (non-return-to-zero-level) code of 8 bits are inputted to a code converting circuit 102 and a CDS (Codeword Digital Sum) converting circuit 103 by way of an input register circuit 101.

The code converting circuit 102 may be constituted by a ROM (read only memory) in which are stored contents of a code conversion table, such as table 3. Randomized 8-bit Byte to 9-bit NRZL Word Mapping pages 15 to 20in the ID-1 format. Code word data $DT_{CODE}$ obtained by conversion of input data $DT_{NRZL}$ into an NRZL code of 9 bits are read out from a memory address of the code converting circuit 102 corresponding to input data $DT_{NRZL}$ and a CDS selection signal $C_{CDS}$ inputted thereto from a controlling circuit 104.

The code word data $DT_{CODE}$ are once converted into serial data $S_{CODE}$ by means of a parallel to serial converting circuit 105 and then inputted to an NRZL/NRZI (non-return-to-zero-level/non-return-to-zero-inverse) converting circuit 106 at which the Serial data code $S_{CODE}$ are NRZL/NRZI converted, and serial output data $S_{NRZI}$ in the form of an NRZI code are sent out from the NRZL/NRZI converting circuit 106.

The CDS converting circuit 103 may also be constituted by a ROM in which are stored contents of a CDS conversion table (Table 3, Randomized 8-bit Byte to 9-bit NRZL Word mapping appealing (pages 15 to 20) in the ID-1 format) similarly to the code converting circuit 102. And CDS data $D_{CDS}$ are read out from a memory address of the CDS converting circuit 103 corresponding to input data $DT_{NRZL}$ and a CDS selection signal $C_{CDS}$ inputted thereto from the controlling circuit 104. The CDS data $D_{CDS}$ thus read out from circuit 103 are sent to an adding/subtracting circuit 107.

The adding/subtracting circuit 107 adds or subtracts CDS data $D_{CDS}$ to or from DSV (Digital Sum Variation) data $D_{DSV}$ in response to an addition/subtraction controlling signal $C_{AS}$ inputted thereto from the controlling circuit 104. The result of such calculation is added cumulatively at an accumulator circuit 108. Then, DSV data $D_{DSV}$ obtained by such cumulative addition are inputted from the accumulator circuit 108 to the adding/subtracting circuit 107.

Meanwhile, inputted to the controlling circuit 104 are a CDS signal $S_{CDS}$ from the CDS converting circuit 103, A DSV signal $S_{DSV}$ in the form of a code bit of DSV data $D_{DSV}$ from the accumulator circuit 108 and a last bit signal $S_{NRZI}$ of code word data $DT_{CODE}$ after NRZL/NRZI conversion by the NRZL/NRZI converting circuit 106. Then, the controlling circuit 104 sends out a CDS selection signal $C_{CDS}$ for the code converting circuit 102 and the CDS converting circuit 103 in accordance with a a control table, such as, Table 4, 9-bit NRZL Word Selection appearing at page 21, and Table 5, DSV Calculation Using Preamble Run-up and Sync Pattern at page 22 of the ID-1 format. The controlling circuit 104 further sends out an addition/subtraction controlling signal $C_{AS}$ for the adding/subtracting circuit 107.

It is to be noted that, in the 8-9 modulating circuit 10 of FIG. 9, a reset signal $S_{RST}$ is inputted to the controlling circuit 104 and the accumulator circuit 108 so that the entire 8-9 modulating circuit 10 may be initialized for each sector SEC.

In the ID-1 format, magnetization patterns are individually specified for the rising sequence RUS of the preamble portion PR, the synchronization codes $SYNC_{PR}$ and $SYNC_{PS}$ of the preamble portion PR and postamble portion PS and the block synchronization code $SYNC_{BLK}$ of synchronization block BLK.

In particular, the rising sequence RUS of the preamble portion PR is specified to have a magnetization pattern which consists of the 18-bit "001110001 110001110" repeated 10 times from the LSB (least significant bit), while the synchronization codes $SYNC_{PR}$ and $SYNC_{PS}$ of the preamble portion PR and postamble portion PS are specified to have another magnetization pattern represented by "000011001 111111110 010111000 000001101" in order from the LSB, and the block synchronization code $SYNC_{BLK}$ of the synchronization block BLK is specified to have still another magnetization pattern represented by "111100110 000000001 101000111 111110010" in order from the LSB, as in the 5.4 Helical Record Content. Format, Synchronization, and Recording Method at pages 7 to 11.

In the 8-9 modulating circuit 10 having the circuit construction described above, the polarity of serial output data $DT_{NRZI}$ obtained by NRZL/NRZI conversion of input data $DT_{NRZL}$ is specified by the polarity of the last bit $S_{NRZI}$ of serial output data $DT_{NRZI}$ immediately preceding the current serial output data. Accordingly, a problem arises in that the synchronization code $SYNC_{PR}$ or $SYNC_{PS}$ or the block synchronization code $SYNC_{BLK}$ cannot be recorded with a specified magnetization pattern.

Consequently, although in the recording system 1 (FIG. 3) of the data recorder, a synchronization code $SYNC_{PR}$ or $SYNC_{PS}$ or a block synchronization code $SYNC_{BLK}$ from the synchronization code generating circuit 12 is combined at a predetermined timing with data after 8-9 modulation from the 8-9 modulating circuit 10, there is the further problem that the polarity data after NRZL/NRZI conversion becomes indefinite and cannot be reproduced by a reproducing system.

On the other hand, the inner code error detecting and correcting circuit 26 of the reproducing system 20 (FIG. 8) of the data recorder actually operates in the following manner. Identification data $ID_B$, synchronization block data $DT_{BLK}$ and a parity code RI are written in that order at an address corresponding to each of identification data $ID_B$ of those synchronization blocks BLK which are free from errors or the errors of which have been corrected. On the other hand, only an inner code error flag FLG$_{IN}$ is added to each of those synchronization blocks BLK which cannot be corrected to eliminate an error, and writing of such synchronization blocks BLK into the memory is suspended.

The outer code error detecting and correcting circuit 29 successively reads the two memories MEM1 and MEM2 of the memory 28, into which an output of the inner code error detecting and correcting circuit 26 has been written, for each 128 bytes in the column direction and executes error detection and correction processing using an outer code. Recorded information data DT$_{USE}$ are reproduced in this manner.

If, in the reproducing system 20 of the data recorder described above, writing into the memory of a synchronization block BLK for which an error cannot be corrected is suspended by the inner code error detecting and correcting circuit 26, then in case an error takes place at a portion other than the synchronization block data DT$_{BLK}$, that is, at the synchronization code SYNCBLK, the identification data ID$_B$ or the parity code RI and this makes correction of an error impossible, the synchronization block data DT$_{BLK}$ which are not actually in error will also not be written into the memory. Consequently, the correct synchronization block data DT$_{BLK}$ cannot be sent to the outer code error detecting and correcting circuit 29. As a result, there is a problem in that the outer code error detecting and correcting circuit 29 may also make correction of an error impossible.

In the even that the inner code error detecting and correcting circuit 26 corrects an error of a synchronization block BLK in error and the identification data ID$_B$ of the synchronization block BLK are also in error, the synchronization block BLK is written as a correct synchronization block BLK at a wrong memory address. Accordingly, there is a problem in that, in case the outer code error detecting and correcting circuit 29 executes an erasure calculation as a result, further correction will be erroneously effected.

In the event that data of all "0"s are inputted, due to a dropout on the magnetic tape 15 or the like, for a synchronization block BLK wherein the identification data ID$_B$ have a value other than "00", a synchronization block BLK of all "0"s is written as correct data at an address of the memory for which the identification data ID$_B$ have the value "00". Accordingly, there is a problem in that, if the outer code error detecting and correcting circuit 29 makes an erasure calculation, further correction will will be erroneously effected as described above.

OBJECTS AND SUMMARY OF THE INVENTION

It is an object of the present invention to provide a magnetic recording and reproducing device which can accurately record and reproduce input information data.

It is another object of the present invention to provide a magnetic recording and reproducing device which can effect dc free NRZL/NRZI conversion of data and wherein prescribed data are included in part of a magnetization pattern.

It is a further object of the present invention to provide a magnetic recording and reproducing device which is significantly improved in error correction efficiency and accuracy.

It is a still further object of the present invention to provide a data transmission system which can effect dc free NRZL/NRZI conversion of data and wherein prescribed data are included in part of a magnetization pattern.

It is a yet further object of the present invention to provide an error correcting circuit which is significantly improved in error correction efficiency and accuracy.

In accordance with one aspect of the present invention, in an information transmission system for coding n-bit information data in the form of an NRZL code into m-bit coded data such that each information data corresponds to only one of the coded data which are all different from one another, n being greater than 2 and m being greater than n, NRZI converting the m-bit coded data such that the DSV of thus previously NRZI converted m-bit coded data is selected as a next NRZI conversion input to limit the DSV of the NRZI converted signal and transmitting the thus NRZI converted coded data, the combination of: first controlling means for generating a control signal to control the NRZI conversion of m-bit coded data and for forming a mode signal; code generating means for generating identification data having a predetermined data pattern corresponding to the n-bit information data and for outputting the identification data and the m-bit coded data obtained by such coding of the n-bit information data in response to the mode signal and a coding control signal; CDS generating means for generating a CDS corresponding to the identification data and m-bit coded data output by the code generating means in response to the mode signal and the coding control signal, NRZI converting means responsive to the control signal from the first controlling means for outputting the identification data obtained from the code generating means as they are, that is, without NRZI converting the same, and for executing NRZI conversion of the m-bit coded data from the code generating means using an initial value determined by a conversion initial value signal; latching means for latching the last bit of the identification data from the NRZI converting means and providing the latched bit as the conversion initial value signal, DSV detecting means for detecting a current DSV corresponding to an output signal of the NRZI converting means in response to the conversion initial value signal from the CDS generating means and a DSV immediately preceding the current DSV; and second controlling means for generating the coding control signal in response to the control signal from the first control means, the identification data and m-bit coded data from the CDS generating means, the conversion initial value signal and the detected current DSV from the DSV detecting means to limit the DSV of the output signal of the NRZI converting means.

According to another aspect of the present invention, there is provided an information transmission system for converting coded data in the form of an NRZL code into an NRZI code and transmitting the NRZI code together with identification data of a predetermined data pattern, such information transmission system comprising an NRZI converting circuit for NRZI converting the coded data but outputting the identification data without NRZI converting the same, and a latch circuit for latching the last bit included in the identification data of an output of the NRZI converting circuit, the converting circuit NRZI using output data of the latch circuit as an initial value, when NRZI converting the coded data.

According to a further aspect of the present invention, there is provided an information recording device for converting coded data in the form of an NRZL code into an NRZI code and recording the NRZI code together with identification data of a predetermined data pattern, such information recording device comprising an NRZI converting circuit for NRZI converting the coded data but outputting the identification data without NRZI converting the same, and a latch circuit for latching the last bit included in the identification data of an output of the NRZI converting circuit, the converting circuit using output data of the latch circuit as an initial value, when NRZI converting the coded data, and an output signal of the NRZI converting circuit being recorded onto a record medium.

According to a still further aspect of the present invention, there is provided an error correcting device for receiving transmission data including information data to which an error correction code of the product sign format is added and correcting an error of the transmission data: such error correcting devices comprising inner code error detecting and correcting means for detecting an inner code error of the transmission data, correcting the thus detected inner code error and outputting inner code correction data of a predetermined block data unit; memory means for storing the inner code correction data therein; counting means for counting the inner code correction data for each unit of block data identification data detecting means for detecting identification data of each unit of the block data of the inner code correction data which are free from error or have been corrected to eliminate an error; offset detecting means for detecting an offset between output data of the counting means and output data of the identification data detecting means; adding means for adding the output data of the identification data detecting means and offset data from the offset detecting means and providing data which is a result of such addition as preset data for the counting means; and outer code error detecting and correcting means for reading out data stored in the memory means in accordance with a series of outer codes using the offset data from the offset detecting means, detecting an outer code error of the data thus read out of the memory means and correcting the outer code error thus detected, a write address of the memory means being designated in accordance with output data of the counting means.

According to still another aspect of the present invention, there is provided an error correcting device for receiving transmission data including information data to which an error correcting code of the product sign format is added and correcting an error of the transmission data: such error correcting device comprising inner code error detecting and correcting means for detecting an inner code error of the transmission data, correcting the thus detected inner code error and outputting inner code correction data of a predetermined block data unit; memory means for storing the inner code correction data therein; counting means for counting the inner code correction data for each unit of block data; identification data detecting means for detecting identification data of each unit of the block data of the inner code correction data which are free from an error or have been corrected to eliminate an error; monitoring means for monitoring continuity of the block data in accordance with output data of the counting means output data of the identification data detecting means and an error flag from the inner code error detecting and correcting means, and for judging in response to such monitoring whether or not the block data are correct; data delecting means for selecting either the output data of the counting means or the output data of the identification data detecting means as an output signal in response to an output signal of the monitoring means; address generating means for generating address data at which the inner code correction data are to be written into the memory means in response to output data of the data selecting means; and outer code error detecting and correcting means for reading out data stored in the memory means in accordance with a series of outer codes, detecting an outer code error of the data thus read out and correcting the thus detected outer code error.

According to still another aspect of the present invention, there is provided, in an information data recording and reproducing device for adding an error correction code of the product sign format to input information data to form coded data, NRZI converting the coded data, recording the NRZI converted coded data together with identification data of a predetermined data pattern onto a record medium, and executing error detecting and correcting processing of reproduction data obtained from such record medium to reproduce data recorded on the record medium, the combination comprising: NRZI converting means including an NRZI converting circuit for outputting the identification data without NRZI converting the same and for NRZI converting the coded data, and a latch circuit for latching the last bit of the identification data outputted from the NRZI converting circuit for use by the latter as an initial value in converting the coded data; inner code error detecting and correcting means for detecting an inner code error of the transmission data, correcting the thus detected inner code error and outputting inner code correction data of a predetermined block data unit; memory means for storing the inner code correction data therein; counting means for counting the inner code correction data for each unit of block data, identification data detecting means for detecting identification data of each unit of the block data of the inner code correction data which are free from error or have been corrected to eliminate an error; offset detecting means for detecting an offset between output data of the counting means and output data of the identification data detecting means; adding means for adding the output data of the identification data detecting means and offset data from the offset detecting means and providing data which is the result of such addition as preset data for the counting means; monitoring means for monitoring continuity of the block data in accordance with output data of the counting means, output data of the identification data detecting means, and an error flag from the inner code error detecting and correcting means and for judging in response to such monitoring whether or not the block data are correct; data selecting means for selecting either the output data of the counting means or the output data of the identification data detecting means as an output signal in response to an output signal of the monitoring means; address generating means for generating address data at which the inner code correction data are to be written into the memory means in response to output data of the data selecting means; and outer code error detecting and correcting means for reading out data stored in the memory means in accordance with a series of outer codes using offset data from the offset detecting means, detecting an outer code error of the data thus read out and correcting the outer code error thus detected.

The above and other objects, features and advantages of the present invention will become apparent from the following description of illustrative embodiments which is to be read in conjunction with the accompanying drawings in which like parts are denoted by like reference characters all through the drawings.

BRIEF DESCRIPTION OF THE DRAWINGS

FIG. 13 is an illustration showing operation of the error correcting circuit shown in FIG. 13.

DETAILED DESCRIPTION OF PREFERRED EMBODIMENTS OF THE INVENTION

Figure 1:
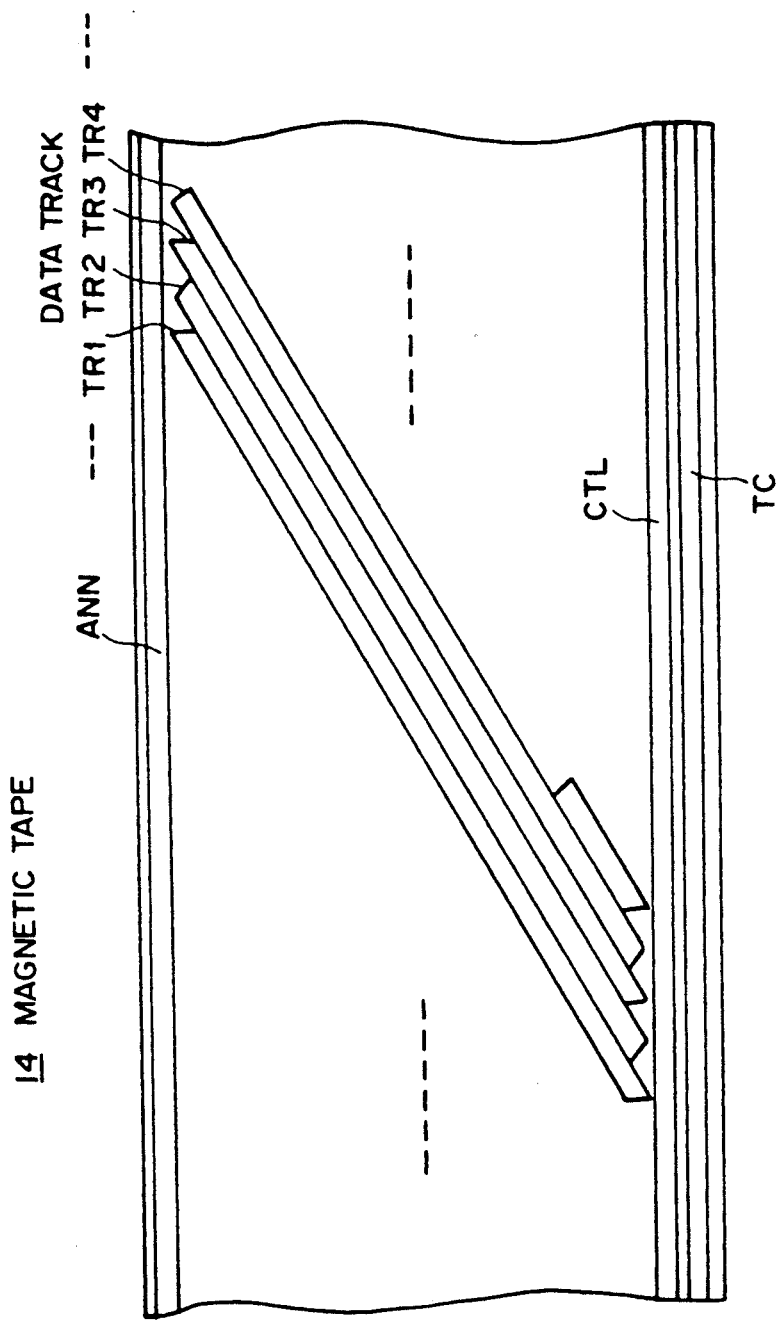
FIG. 1 is a diagrammatic view illustrating a record pattern recorded on a magnetic tape conforming to the ID-1 format.
Figure 2:
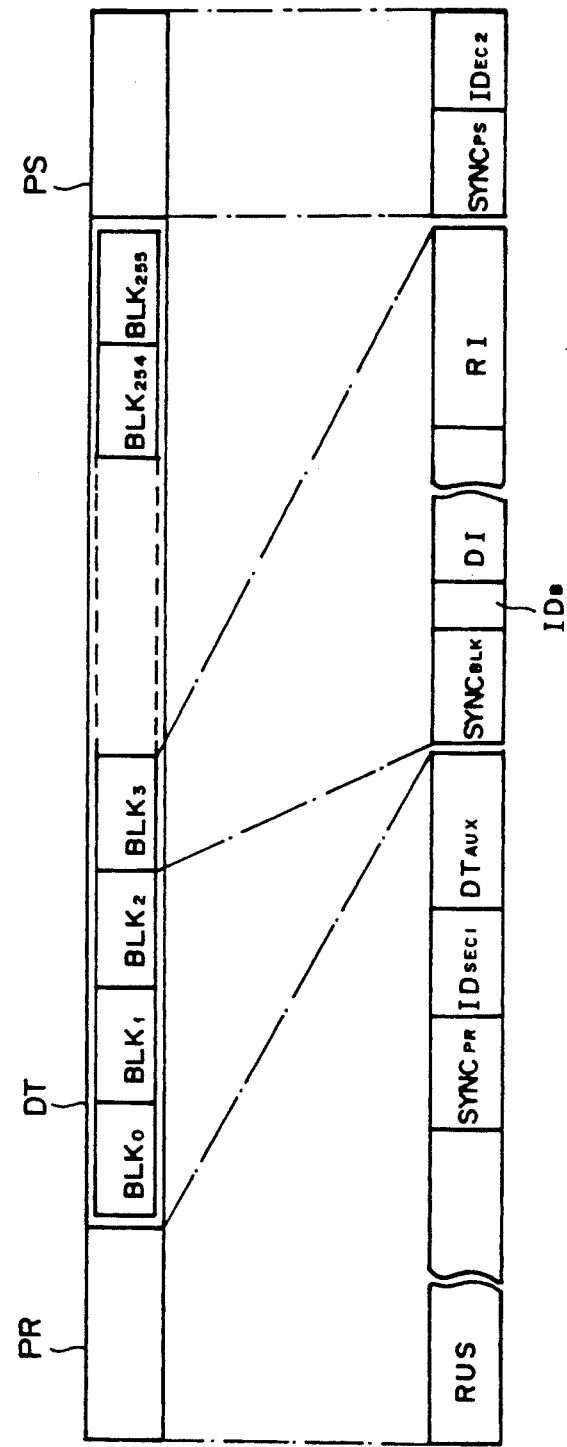
FIG. 2 is a diagrammatic view illustrating contents included in a record track of the record pattern shown in FIG. 1.
Figure 3:
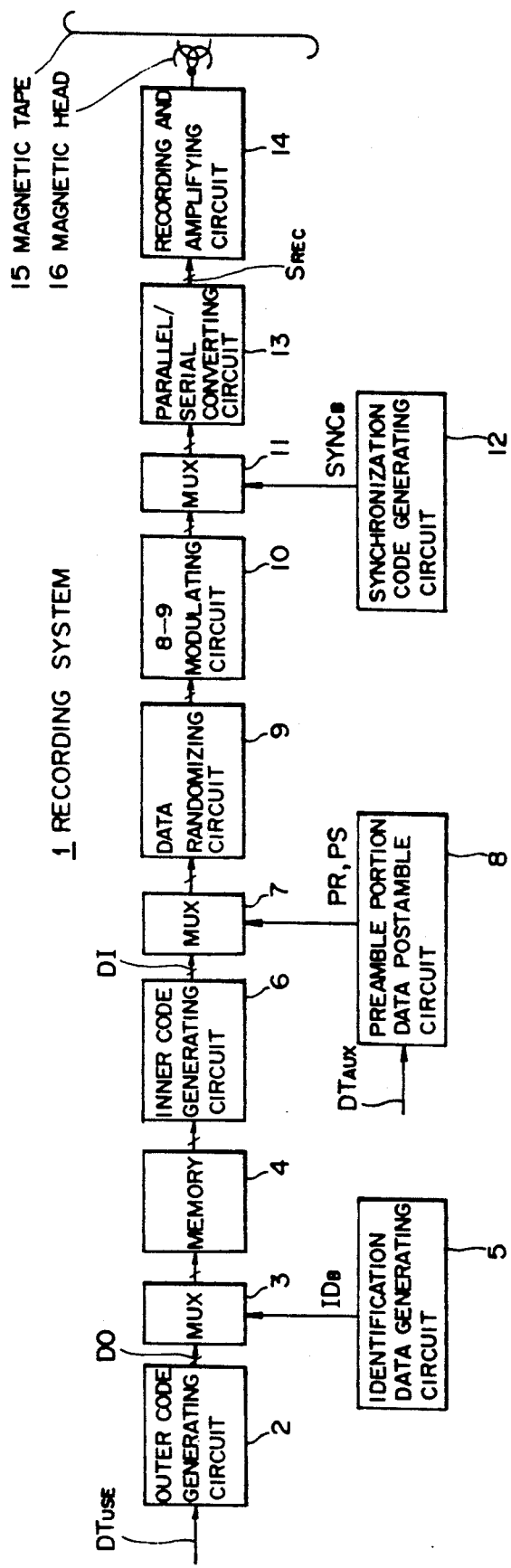
FIG. 3 is a block diagram showing a recording system of a conventional data recorder.
Figure 4:
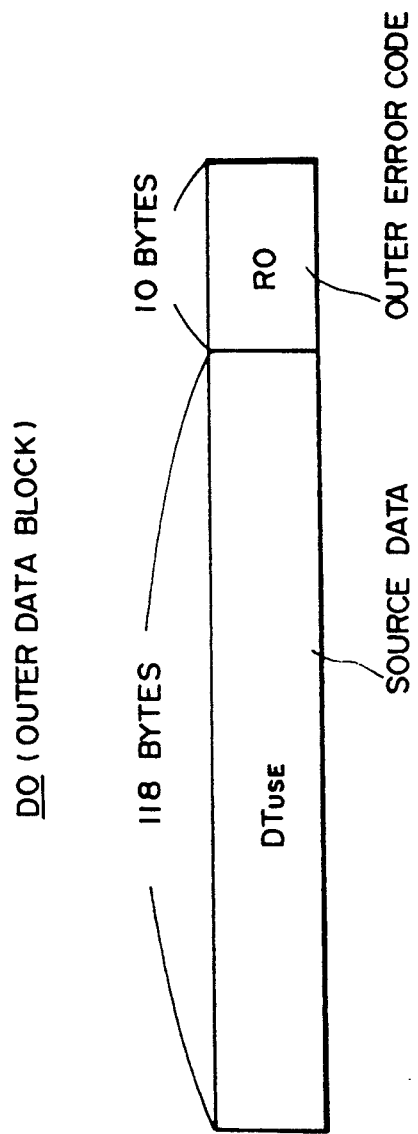
FIG. 4 is a diagrammatic view illustrating output data of an outer code generating circuit of the recording system of FIG. 3.
Figure 8:
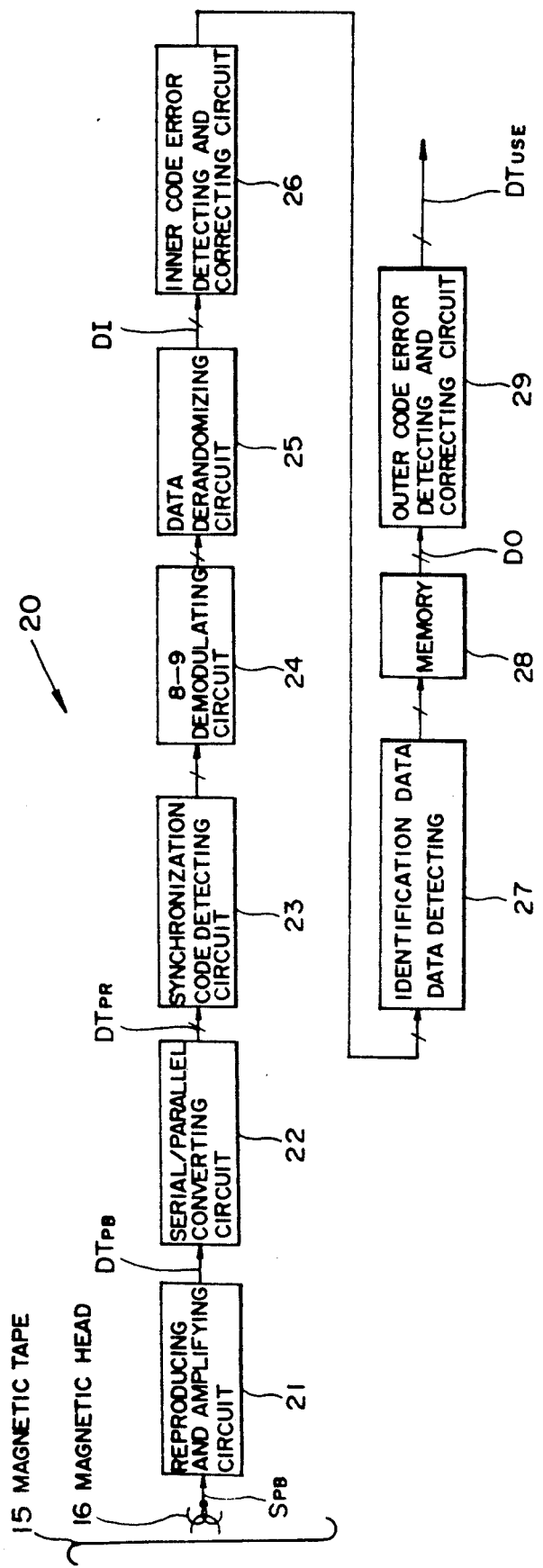
FIG. 8 is a block diagram showing a reproducing system of the conventional data recorder.
Figure 10:
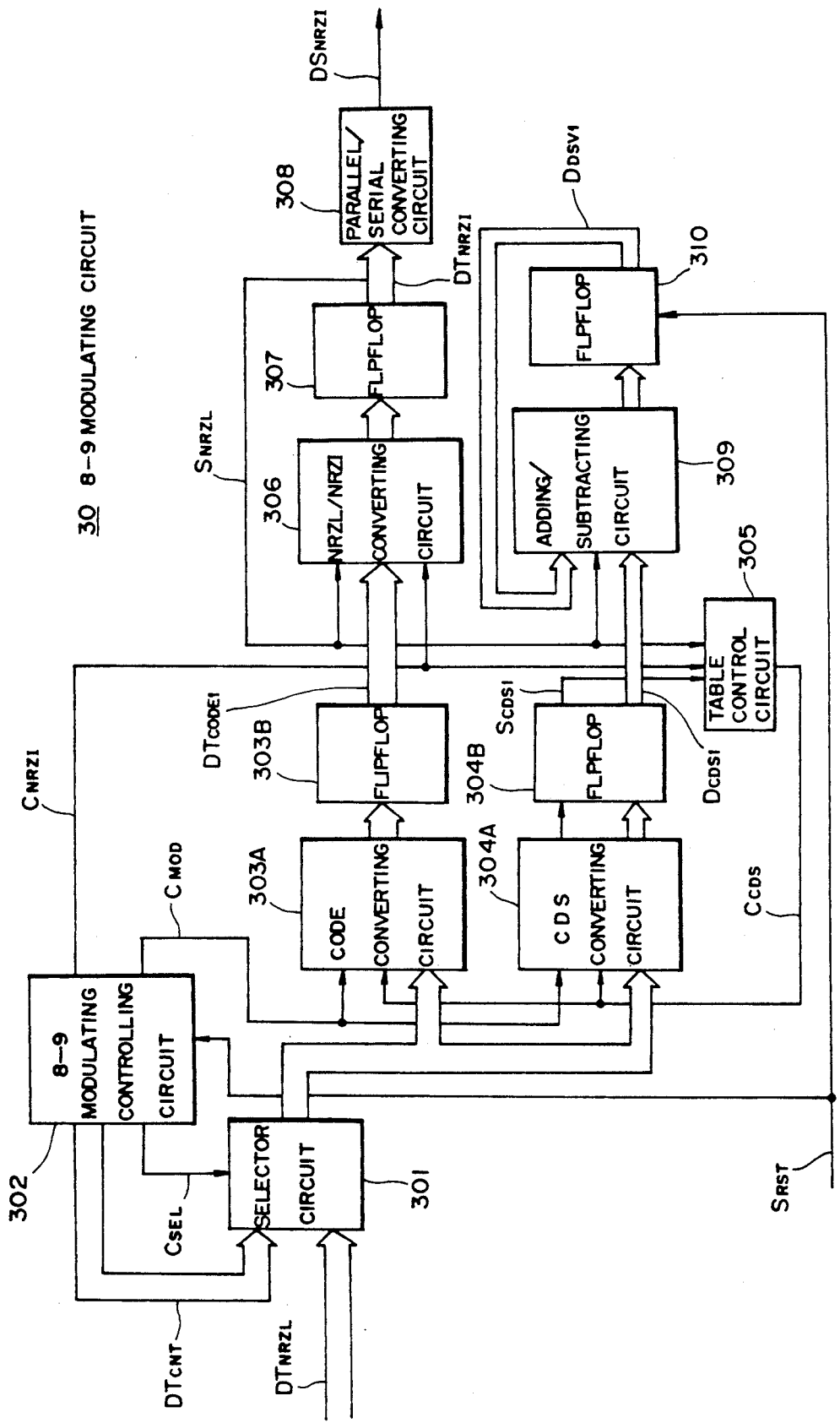
FIG. 10 is a block diagram of an 8-9 modulating circuit in accordance with an embodiment of the present invention.

Referring now to FIG. 10, it will be seen that an 8-9 modulating circuit 30 to which the present invention is applied is suitably incorporated in a magnetic recording and reproducing device which may include such a recording system 1 as shown in FIG. 3 and a reproducing system 20 as shown in FIG. 8. The 8-9 modulating circuit 30 includes a selector circuit 301 at which it receives input data $DT_{NRZL}$ in the form of an 8-bit NRZL code.

Byte count data $DT_{CNT}$ from an 8-9 modulating controlling circuit 302 are inputted to the selector circuit 301, and either input data $DT_{NRZL}$ or byte count data $DT_{CNT}$ are selectively inputted to a code converting circuit 303A and a CDS converting circuit 304A in response to an input selection control signal $C_{SEL}$ supplied from the 8-9 modulation controlling circuit 302.

Figure 9:
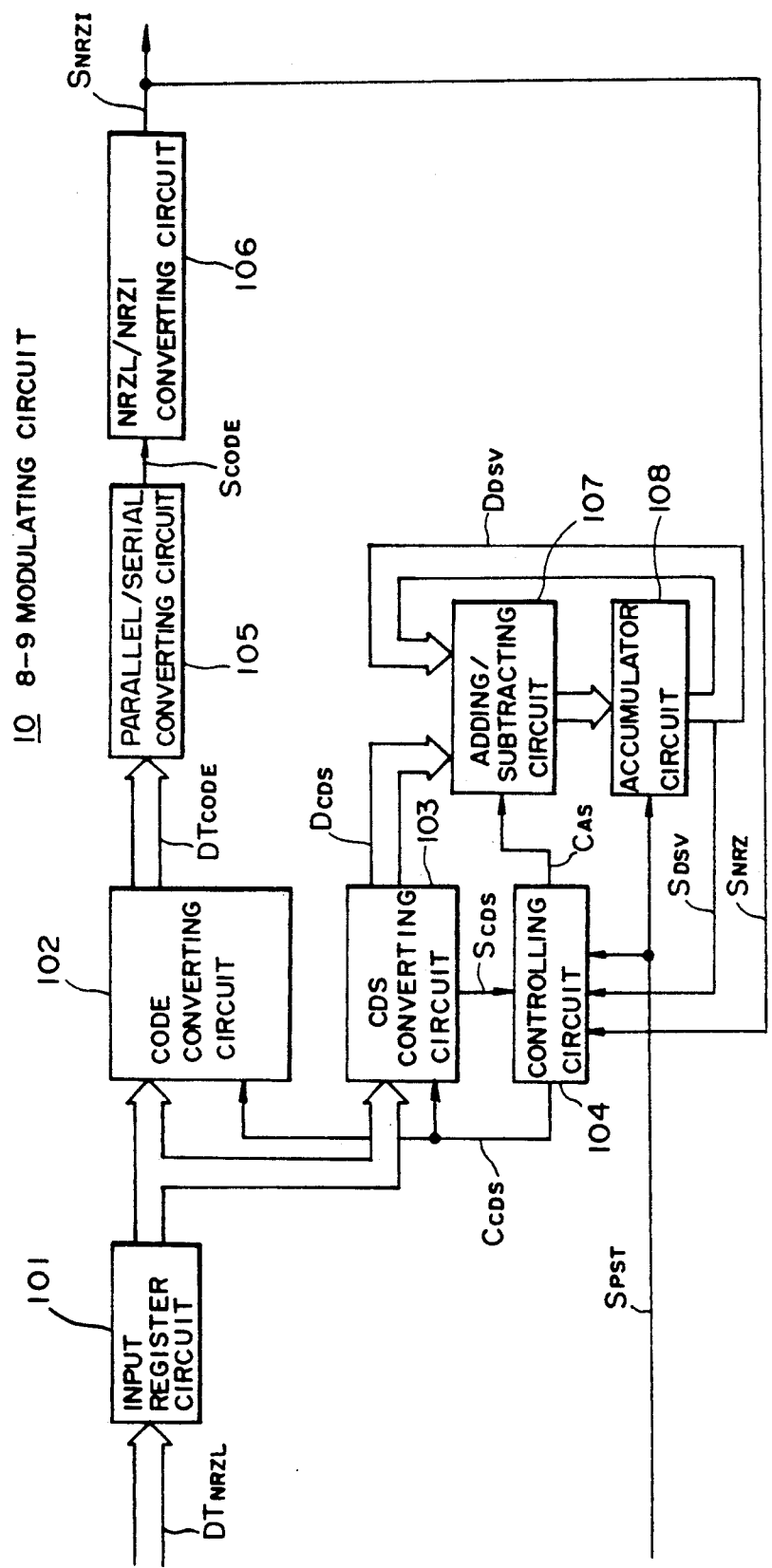
FIG. 9 is a block diagram showing a conventional 8-9 modulating circuit employed in the recording system of FIG. 3.

The code converting circuit 303A may be in the form of a ROM containing a code conversion table corresponding to Table 3 Randomized 8-bit Byte to 9-bit NRZL Word Mapping, at pages 16 to 20 in the ID-1 format, similarly to the conventional code converting circuit 102 in FIG. 9. Further, pattern data $DT_{PTN}$ corresponding to the rising sequence RUS of the preamble portion PR, the synchronization codes $SYNC_{PR}$ and $SYNC_{PS}$ of the preamble portion PR and postamble portion PS and the block synchronization codes $SYNC_{BLK}$ of the synchronization blocks BLK are stored in an area of the ROM of the code converting circuit 303A following the code conversion table.

In the case of the present 8-9 modulating circuit 30, the pattern data $DT_{PTN}$ comprise first pattern data $DT_{PTN1}$ of 2 bytes of patterns of "001110001" and "110001110" in order from the LSB as the rising sequence RUS of the preamble portion PR, second pattern data $DT_{PTN2}$ of 4 bytes of "000011001", "111111110", "010111000" and "000001101" in order from the LSB as the synchronization codes $SYNC_{PR}$ and $SYNC_{PS}$ of the preamble portion PR and postamble portion PS, and third pattern data $DT_{PTN3}$ of 4 bytes of "111100110", "000000001", "101000111" and "111110010" in order from the LSB as the block synchronization code $SYNC_{BLK}$ of the synchronization block BLK.

It is to be noted that the code converting operation of the code converting circuit 303A is controlled in accordance with a mode control signal $C_{MOD}$ from the 8-9 modulation controlling circuit 302. When the mode control signal $C_{MOD}$ represents a conversion mode for the rising sequence RUS of the preamble portion PR, byte count data $DT_{CNT}$ which include 10 repeats of count values "0" and "1" are inputted to the code converting circuit 303A from the 8-9 modulation controlling circuit 302 by way of the selector circuit 301.

Consequently, the code converting circuit 303A reads out the patterns "001110001" and "110001110" of the first pattern data $DT_{PTN1}$ alternately, and thus, as the rising sequence RUS of the preamble portion PR, a magnetization pattern of 180 bits consisting of 10 repeats of the 18-bit symbol "001110001 110001110" in order from the LSB is sent out as code word data $DT_{CODE1}$ to an NRZL/NRZI converting circuit 306 by way of a first flipflop 303B.

On the other hand, when the mode control signal $C_{MOD}$ represents another conversion mode for the synchronization code $SYNC_{PR}$ or $SYNC_{PS}$ of the preamble portion PR or postamble portion PS, byte count data $DT_{CNT}$ having a count value of "0", "1", "2" or "3" are inputted to the code converting circuit 303A from the 8-9 modulation controlling circuit 302 by way of the selector 301.

Consequently, the code converting circuit 303A successively reads out the patterns "000011001", "111111110", "010111000" and "000001101" of the second pattern data $DT_{PTN2}$, and thus, as the synchronization code $SYNC_{PR}$ or $SYNC_{PS}$ of the preamble portion PR or postamble portion PS, the 36-bit magnetization pattern "000011001 111111110 010111000 000001101" in order from the LSB is sent out as code data $DT_{CODE1}$ to the NRZL/NRZI converting circuit 306 by way of the first flipflop 303B.

Otherwise, when the mode control signal $C_{MOD}$ represents a conversion mode for the block synchronization code $SYNC_{BLK}$ of the synchronization block BLK, byte count data $DT_{CNT}$ having a count value "0", "1", "2" or "3" are inputted to the code converting circuit 303A from the 8-9 modulation controlling circuit 302 by way of the selector 301.

Consequently, the code converting circuit 303A successively reads out the patterns "111100110", "000000001", "101000111" and "111110010" of the third pattern data $DT_{PTN3}$, and thus, as the block synchronization code $SYNC_{BLK}$ of the synchronization block BLK, 36-bit magnetization pattern "111100110 000000001 101000111 111110010" in order from the LSB is sent out as code word data $DT_{CODE1}$ to the NRZL/NRZI converting circuit 306 by way of the first flipflop 303B.

It is to be noted that, in case the mode control signal $C_{MOD}$ represents any mode other than those described above, input data $DT_{NRZL}$ in the form of an 8-bit NRZL code are inputted to the code converting circuit 303A by way of the selector 301, and code word data $DT_{CODE1}$ obtained by conversion of the input data $DT_{NRZL}$ into an NRZL code of 9 bits are sent out from a memory address corresponding to the input data $DT_{NRZL}$, and a CDS selection signal $C_{CDS}$ is supplied from a table control circuit 305 to the NRZL/NRZI converting circuit 306 by way of the first flipflop 303B, similarly to the conventional code converting circuit 102 shown in FIG. 9.

In the embodiment of the invention shown in FIG. 10, the NRZL/NRZI converting circuit 306 may be in the form of a ROM, and contents of such ROM at an address corresponding to a 9-bit NRZL code word data $DT_{CODE1}$ and an initial value signal $S_{NRZL}$ are read out from the ROM of the NRZL/NRZI converting circuit 306. Such read-out data $DT_{NRZI}$ in the form of a parallel 9-bit NRZI code is supplied to a parallel/serial converting circuit 308 by way of a second flipflop 307.

It is to be noted that the initial value signal $S_{NRZL}$ is formed from the MSB of output data $DT_{NRZI}$ from the second flipflop 307 and is used as an initial value when a next succeeding code word data $DT_{CODE1}$ is to be NRZI converted.

In the 8-9 modulating circuit 30, an NRZI conversion control signal $C_{NRZI}$ is inputted from the 8-9 modulating controlling circuit 302 to the NRZL/NRZI converting circuit 306, and, when the NRZI conversion control signal $C_{NRZI}$ calls for non-conversion by the circuit 306, that is, when the inputted code word data $DT_{CODE1}$ has the predetermined pattern data $DT_{PTN1}$, $DT_{PTN2}$ or $DT_{PTN3}$ in the form of the rising sequence RUS of the preamble portion PR, the synchronization code $SYNC_{PR}$ or $SYNC_{PS}$ of the preamble portion PR or postamble portion PS or the block synchronization code $SYNC_{BLK}$ of the synchronization block BLK, the code word data $DT_{CODE1}$ supplied to the NRZL/NRZI converting circuit 306 are output unchanged therefrom to the parallel/serial converting circuit 308 by way of the second flipflop 307.

Thus, an NRZI signal $DT_{NRZL}$ obtained by 8-9 modulation and NRZL/NRZI conversion of input data $DT_{NRZL}$ and formatted in accordance with the ID-1 format is supplied from the parallel/serial converting circuit 308.

The CDS converting circuit 304A may also include a ROM similar to that of the code converting circuit 303A, and contents of a CDS conversion table, such as, Table 3, Randomized 8-bit Byte to 9-bit NRZL Word Mapping, at pages 15 to 20 specified in the ID-1 format, are stored in the ROM of the CDS converting circuit 304A, as was described above in the case of the conventional CDS converting circuit 103 shown in FIG. 9. In addition, in the case of the present 8-9 modulating circuit 30, CDS data $D_{CDS1}$ corresponding to pattern data $DT_{PTN}$ stored in the code converting circuit 303A are stored in an area of the ROM of the CDS converting circuit 304A following the CDS conversion table.

It is also to be noted that the CDS converting operation of the CDS converting circuit 304A is controlled in response to a mode control signal $C_{MOD}$ from the 8-9 modulation controlling circuit 302 similarly to the code converting circuit 303A described hereinabove. When the mode control signal $C_{MOD}$ represents a conversion mode for the rising sequence RUS of the preamble portion PR, another conversion mode for the synchronization code $SYNC_{PR}$ or $SYNC_{PS}$ of the preamble portion PR or postamble portion PS or a further conversion mode for the block synchronization code $SYNC_{BLK}$ of the synchronization block BLK, CDS data $D_{CDS1}$ and read out from a memory address represented by contents of the mode control signal $C_{MOD}$ and byte count data $DT_{CNT}$. The CDS data $D_{CDS1}$ thus read out are supplied to an adding/subtracting circuit 309 by way of a third flipflop 304B.

The adding/subtracting circuit 309 adds or subtracts CDS data $D_{CDS1}$ to or from DSV data $D_{DSU1}$ in response to an initial value signal $S_{NRZL}$ from the second flipflop 307, and a result of such calculation is added cumulatively at a fourth flipflop 310. The DSV data $D_{DSU1}$ obtained by such cumulative addition are inputted to the adding/subtracting circuit 309.

Meanwhile, a CDS signal $S_{CDS1}$ which is supplied from the CDS converting circuit 304A through the third flipflop 304B, an NRZI conversion control signal $C_{NRZI}$ from the 8-9 modulation controlling circuit 302 and an initial value signal $S_{NRZL}$ from the second flipflop 307 are all supplied to the table control circuit 305. The table control circuit 305 emits a CDS selection signal $C_{CDS}$ from the code converting circuit 303A and the CDS converting circuit 304A in accordance with control tables, such as Table 4, 9-bit NRZL Word Selection, at page 101 and Table 5, DSV Calculation Using Preamble Run-up and Sync Pattern, at page 102, of the ID-1 format.

It is to be noted that, in the 8-9 modulating circuit 30, a reset signal $S_{RST}$ is supplied, at a time corresponding to the top of each sector SEC to the 8-9 modulation controlling circuit 302 and the fourth flipflop 310, and consequently, the entire 8-9 modulating circuit 30 is initialized for each sector SEC.

In the mentioned tables, that is, Table 4, 9-bit NRZL Word Selection, at page 101, and Table 5, DSV Calculation Using Preamble Run-up and Sync Pattern at page 102, of the ID-1 format, it is determined whether a positive CDS or a negative CDS is to be selected depending upon whether the value of DSV is in positive or is equal to or negative relative to 0. However, in the case of the present 8-9 modulation circuit 30, CDS and DSV always have opposite polarities so hat it may be determined which one of them is to be selected depending upon whether the value of DSV is equal to or greater than 0 or is negative. Consequently, the MSB of the DSV can be used as data representative of a state of he DSV.

Since, in the embodiment so far described NRZI code word data $DT_{CODE1}$ corresponding to a specified magnetization pattern $DT_{PTN1}$, $DT_{PTN2}$ or $DT_{PTN3}$ are provided and the last bit of the code word data $DT_{CODE1}$ is used as an initial value $S_{NRZL}$ when subsequent NRZL cord word data $DT_{CODE1}$ are to be NRZL/NRZI converted, an initial value for the NRZL/NRZI conversion can be obtained with a single construction. Further, since inputted information data $DT_{NRZL}$ ($DT_{CODE1}$) are NRZL/NRZI converted while in parallel form, the timing adjustment in NRZL/NRZI conversion can be simplified. In doing this, a relatively simple recording device can perform NRZL/NRZI conversion using a magnetization pattern which includes predetermined data.

Although the 8-9 modulating circuit described hereinabove employs a ROM as the NRZL/NRZI converting circuit, it may otherwise be constructed. For example, instead of such ROM, the NRZL/NRZI converting may comprise a logic circuit consisting of a plurality of exclusive OR circuits.

Figure 11:
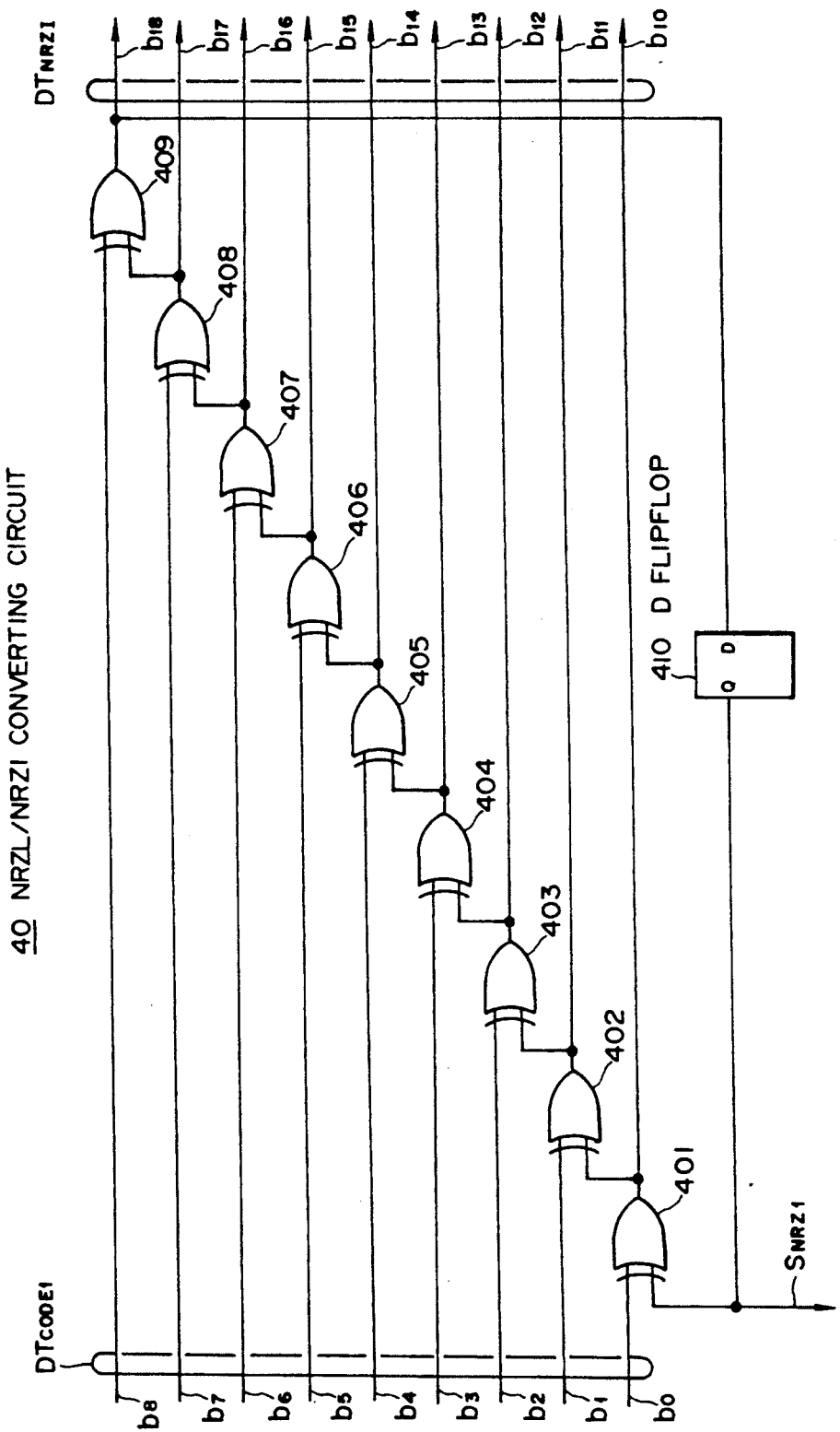
FIG. 11 is a circuit diagram of an NRZL/NRZI converting circuit incorporated in the 8-9 modulating circuit of FIG. 10.

For example, an NRZL/NRZI converting circuit 40 shown in FIG. 11 to be constructed from a combination of 9 exclusive OR circuits 401 to 409, and the most significant bit $b_{18}$ of the immediately preceding 9-bit NRZI converted output $DT_{NRZI}$ is delayed for one clock interval by a flipflop 410 prior to being input to the first exclusive OR circuit 401.

The 9-bit of input data $DT_{NRZL}$, beginning with the least significant bit $B_0$, that is, bits $b_0$ to $b_8$, are supplied respectively to the first to ninth exclusive OR circuits 401 to 409. Logic outputs of the individual exclusive OR circuits 401 to 409, that is, the 9 bits $b_{10}$ to $b_{18}$ of output data $DT_{NRZI}$, are supplied to the second to ninth exclusive OR circuit 402 to 409 respectively, which receive the individual bits $b_1$ to $b_8$, respectively.

In the case of the NRZL/NRZI converting circuit 40, NRZL/NRZI conversion is performed using the most significant bit $b_{18}$ of the immediately preceding 9-bit NRZI converted output data $DT_{NRZI}$ as an initial value.

It is to be noted that, in order for the NRZL/NRZI converting circuit 40 to emit 9-bit input data $DT_{NRZL}$ unchanged as output data $DT_{NRZI}$, the logic outputs to be supplied from the first to eighth exclusive OR circuits 401 to 408 to the second to ninth exclusive OR circuits 402 to 409 and the most significant bit $b_{18}$ of the immediately preceding 9-bit output data $DT_{NRZI}$ to be supplied to the first exclusive OR circuit 401 should be controlled to each be at the logic level "0".

Further, while the 8-9 modulating circuit hereinabove is described incorporated in a magnetic recording device based on the ID-1 format, such modulating circuit can be suitably applied to a wide variety of information transmission devices wherein information data in the form of an NRZL code are converted into the NRZI code, for transmission.

Figure 12:
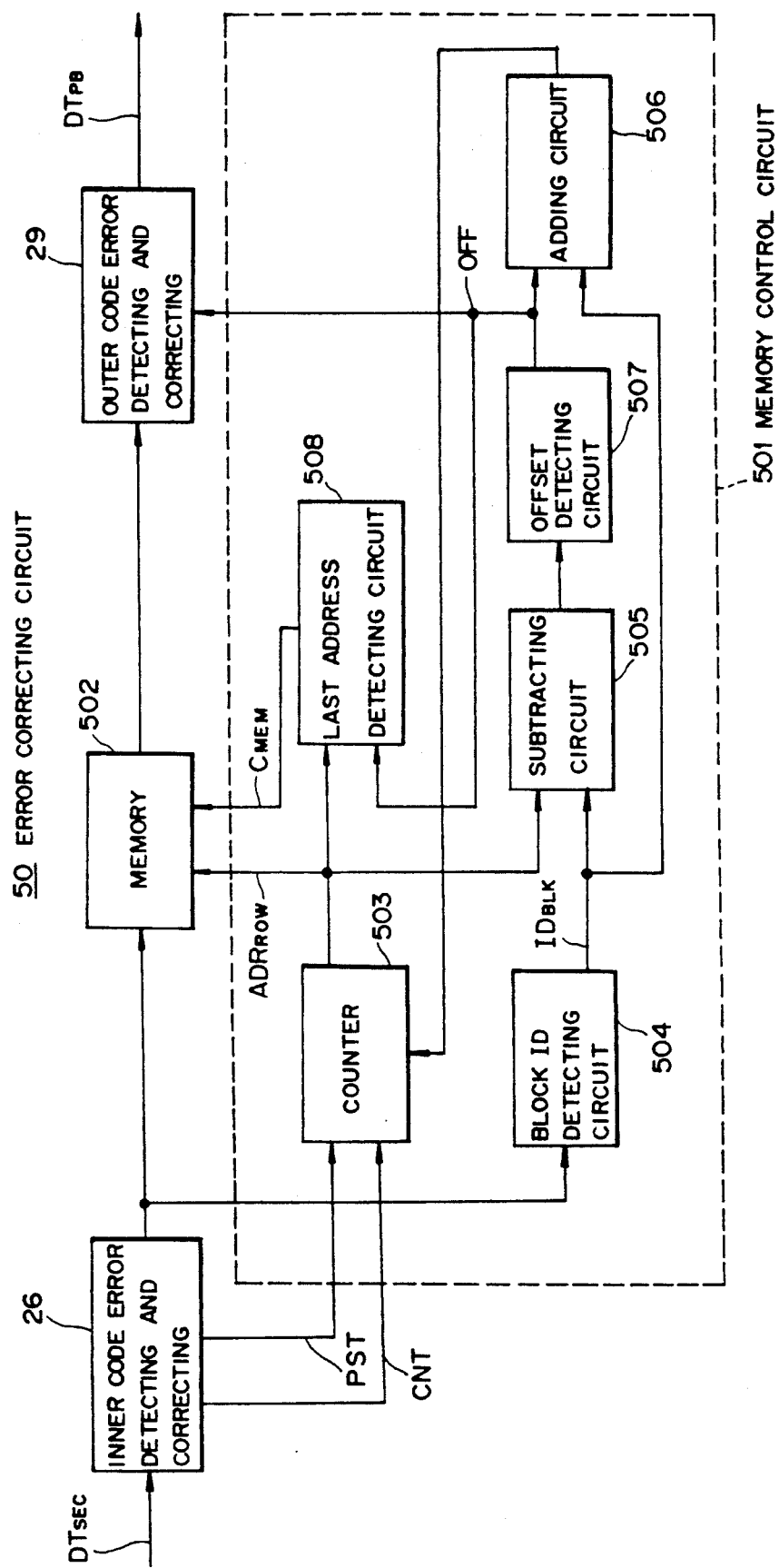
FIG. 12 is a block diagram of an error correcting circuit in accordance with another embodiment of the present invention.

Referring now to FIG. 12, it will be seen that error correcting circuit 50 to which the present invention is applied includes, in a manner similar to the reproducing system 20 of the magnetic recording and reproducing device shown in FIG. 8, an inner code error detecting and correcting circuit 26 which successively executes error detection and correction using an inner code for each of synchronization blocks $BLK_0$ to $BLK_{255}$ of demodulated reproduction data $DT_{SEC}$ for each Sector SEC. Further, circuit 26 writes identification data $ID_8$, synchronization block data $DT_{BLK}$, a parity code RI and an inner code error flag $FLG_{IN}$ of the length, for example, of one byte, all obtained by such error detection and correction, into a memory 502, in the form of a RAM (random access memory) having a construction similar to that of the conventional memory 28 described hereinabove, in response to address information received from a memory control circuit 501.

An outer code error detecting and correcting circuit 29 successively reads the memory 502 for each 128 bytes in the direction of columns in response to address information received from the memory control circuit 501 and then executes error detecting and correcting processing using an outer code with reference to an inner code error flag $FLG_{IN}$ so that information data $DT_{USE}$ recorded on a magnetic tape 15 may be reproduced, as in FIG. 8.

As shown on FIG. 12, the memory control circuit 501 includes an 8-bit counter 503 which is reset to a value "0" in response to a reset signal RST which is emitted at a time when sector identification data $ID_{SEC1}$ are detected by the inner code error detecting and correcting circuit 26.

The counter 503 is of the cyclic type which executes a counting up operation successively from a count value "0" to another count value "255" in response to a count pulse CNT developed in the inner code error detecting and correcting circuit 26 each time a synchronization block $BLK_0$ to $BLK_{255}$ is thereto but which returns to the value "0" when an overflow takes place.

Figure 5:
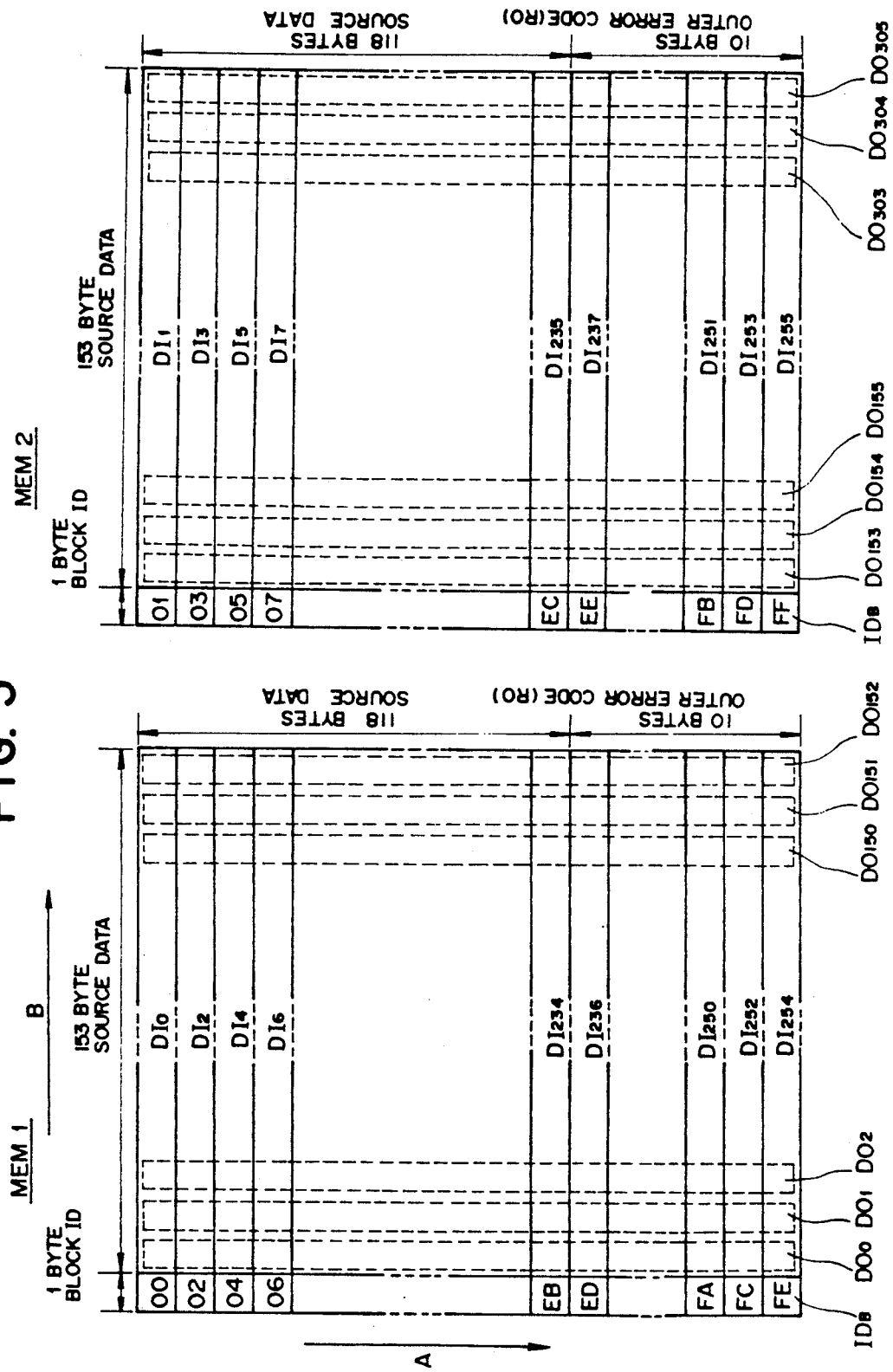
FIG. 5 is a diagrammatic view showing a two-part memory of the recording system of FIG. 3.
Figure 6:
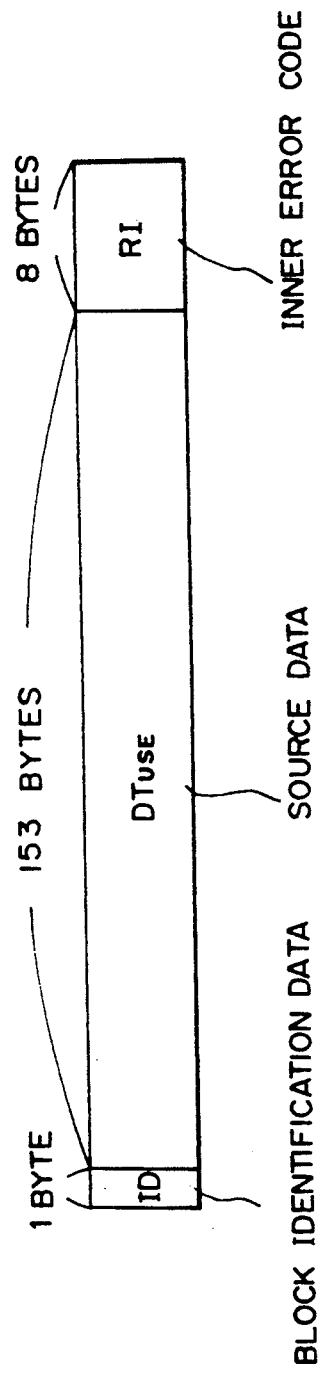
FIG. 6 is a diagrammatic view illustrating output data of an inner code generating circuit of the recording system of FIG. 3.
Figure 7:
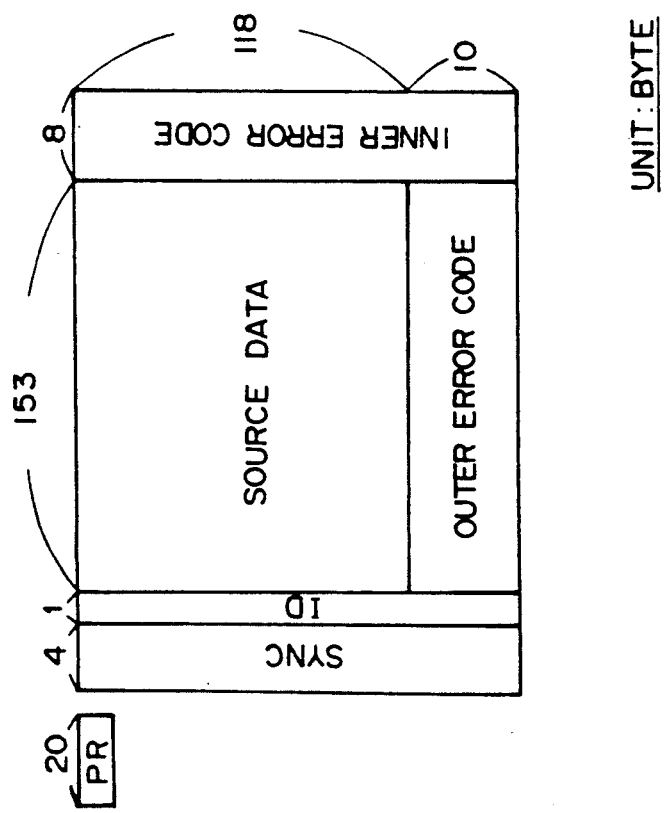
FIG. 7 is a diagrammatic view showing data maps for data to be processed by the recording system of FIG. 3.

The memory 502 includes a pair of memory matrices MEM10 and MEM20 (FIG. 13) each having a capacity of 154×128 bytes arranged in rows and columns similarly to the memories MEM1 and MEM2 described hereinabove with reference to FIG. 5 so that 7-byte identification data $ID_8$ and synchronization block data $DT_{BLK}$ corresponding to a 153-byte synchronization block BLK received from the inner code error detecting and correcting circuit 26 may be stored in a row.

It is to be noted that a count value sent out from the counter 503 is used as a memory address $ADR_{ROW}$ of a row of the memory matrices MEM10 and MEM20 and is supplied to the memory 502.

In the preferred embodiment, the identification data $ID_8$ and synchronization block data $DT_{BLK}$ for one synchronization block BLK are written into the memory 502 so that the data for even-numbered memory addresses $ADR_{ROW}$ are successively written into the first memory matrix MEM10 while the remaining data for odd-numbered memory addresses $ADR_{ROW}$ are successively written into the second memory matrix MEM20.

Further, in the memory control circuit 501 identification data $ID_8$ and synchronization block data $DT_{BLK}$ for a synchronization block BLK supplied from the inner code error detecting and correcting circuit 26 are also successively inputted to a block ID detecting circuit 504.

The block ID detecting circuit 504 detects identification data $ID_8$ of a synchronization block BLK which is free of error or in which an error has been corrected by reference to an inner code error flag $FLG_{IN}$ in the synchronization block BLK, and supplies the thus detected identification data $ID_B$ to a subtracting circuit 505 and an adding circuit 506.

The identification data $ID_B$ are incremented, when successive synchronization blocks BLK are free of error or have been corrected to eliminate an error, for each of such synchronization blocks BLK similarly to the memory address $ADR_{ROW}$ from the counter 503.

The subtracting circuit 505 calculates a difference between identification data $ID_B$ received from the block ID detecting circuit 504 and a memory address $ADR_{ROW}$ received from the counter 503, and supplies the result of such calculation as a memory offset OFF to an offset detecting circuit 507 which may be in the form of a register.

In the memory control circuit 501, the counter 503 is incremented in response to a count pulse CNT until a first one of the synchronization blocks BLK for one sector SEC which is free of error or has been corrected to eliminate an error is inputted to the memory control circuit 501, and identification data $ID_B$ and synchronization block data $DT_{BLK}$ for a synchronization block BLK are written into a location of the memory address $ADR_{ROW}$ designated by the count value of the counter 503.

On the other hand, if the first inputted synchronization block BLK of the synchronization blocks BLK for one sector SEC is free of error or has been corrected to eliminate an error then a difference between the identification data $ID_B$ and the memory address $ADR_{ROW}$ is stored as a memory offset OFF in the offset detecting circuit 507. If, thereafter, a synchronization block BLK for which error correction is impossible is inputted, identification data $ID_B$ and synchronization block data $DT_{BLK}$ for that one synchronization block BLK are written into a location of the memory designated by the memory address $ADR_{ROW}$ received from the counter 503.

On the other hand, if a memory offset OFF is stored in circuit 507 a synchronization block BLK which is free of error error or has been corrected to eliminate an error is inputted, then the identification data $ID_B$ of the synchronization block BLK and the memory offset OFF held in the offset detecting circuit 507 are added by the adding circuit 506, and the result of such addition is loaded into the counter 503. The identification data $ID_B$ and synchronization block data $DT_{BLK}$ for a synchronization block BLK are written into a location of the memory designated by the memory address $ADR_{ROW}$ which is supplied from the counter 503 after such loading of the latter.

It is to be noted that a memory offset OFF held in the offset detecting circuit 507 and a memory address $ADR_{ROW}$ from the counter 503 are inputted to a last address detecting circuit 508.

When the last address detecting circuit 508 detects a synchronization block BLK at which the memory address $ADR_{ROW}$ for a sector SEC is equal to a sum of the memory offset OFF and the value "255", the last address detecting circuit 508 provides a memory control signal $C_{MEM}$ to the memory 502 for establishing a writing disabled condition thereof so that writing of succeeding synchronization blocks BLK may be inhibited.

The outer code error detecting and correcting circuit 29 sets, as a reading start address, a first byte of synchronization block data $DT_{BLK}$ corresponding to an offset OFF received from the offset detecting circuit 507, and then successively counts up the reading address from the start address. The outer code error detecting and correcting circuit 29 then read from the memory addresses obtained by such successive counting up operation 128 bytes of data as an outer data block $DO_0$ and executes outer code error detecting and correcting processing of the outer data block $DO_0$.

Thereafter, the outer code error detecting and correcting circuit 29 repeats 152 times similar processing to that described above and sets, as a reading start address for each processing, a first byte of the synchronization block data $DT_{BLK}$ corresponding to an address obtained by addition of the value "1" to the then stored memory offset OFF.

The synchronization block data $DT_{BLK}$ written in the memory 502 are read out in this manner, and the outer code error detecting and correcting circuit 29 performs outer code error detecting and correcting processing including an erasure calculation with reference to the inner code error flag $FLG_{IN}$ and executes re-arrangement in accordance with a series of outer codes. In this manner, information data $DT_{USE}$ recorded on the magnetic tape 15 (FIG. 8), can be reproduced to provide reproduction of data $DT_{PB}$.

In the arrangement described so far, if, for example, identification data $ID_B$, synchronization block data $DT_{BLK}$, a parity code RI and an inner code error flag $FLG_{IN}$ for one synchronization block BLK from the inner code error detecting and correcting circuit 26 are employed as synchronization block input data DT, and the synchronization block input data DT following the top of a sector SEC are successively numbered, then the memory control circuit 501 executes writing in the memory 502 in the order shown in FIG. 13 in which identification data $ID_B$ corresponding to the memory address $ADR_{ROW}$ and synchronization block input data DT are represented in hexadecimal notation.

In particular, the counter 503 of the memory control circuit 501 is reset at the top of each sector SEC in response to a reset signal RST from the inner code error detecting and correcting circuit 26 and synchronization block input data DT received beginning at the top of the sector SEC are written successively into the memory 502 beginning at the start address.

It is to be noted that the memory 502 includes the two memories MEM10 and MEM20 and, when the memory address $ADR_{ROW}$ from the counter 503 has an even-numbered value, data are written into the first memory MEM10, but, when the memory address $ADR_{ROW}$ has an odd-numbered value, data are written into the second memory MEM20.

Accordingly, synchronization block input data DT1 which are inputted first are written into an address of the first memory MEM10 designated by the memory address $ADR_{ROW}$ of the value "00", and then the next synchronization block input data DT2 are written into an address of the second memory MEM20 designated by the memory address $ADR_{ROW}$ of the value "01". Thereafter the synchronization block input data DT3 are written into an address of the first memory MEM10 designated by the memory address $ADR_{ROW}$ of the value "02".

It is to be noted that, in FIG. 13, the first to third synchronization block input data DT1 to DT3 cannot be corrected to eliminated an error and that fact is indicated for each case by a mark "■".

The succeeding fourth and fifth synchronization block input data DT4 and DT5 also cannot be corrected to eliminate an error, so that such fact is similarly indicated and written at addresses identified by address values "03" and "04" of the memory address $ADR_{ROW}$ from the counter 503.

If for the sixth synchronization block input data DT6 inputted subsequently, it is detected by the block ID detecting circuit 504 that the respective identification data $ID_B$ have a value equal to "02", it is determined that the sixth synchronization block input data DT6 are free of error or can be corrected to eliminate an error, and such synchronization block input data are indicated by another mark "□" in FIG. 13.

In this instance, since the data "02" are the first synchronization input data DT in a sector SEC which are detected by the block ID detecting circuit 504 to be free of error or to be capable of being corrected to eliminate an error, the subtracting circuit 505 subtracts the value "02" of the identification data $ID_B$ from the value "05" of the memory address $ADR_{ROW}$ at that time and determines that the value "03" obtained by such subtraction is the memory offset OFF. The subtracting circuit 505 thus provides the memory offset OFF to the offset detecting circuit 507, while the inputted sixth synchronization block input data DT6 is written at the address of the value "05" designated by the memory address $ADR_{ROW}$.

If the seventh synchronization block input data DT7 then inputted are synchronization block input data DT which are free of error or can be corrected to eliminate an error, as can be seen from the mark "☐" in FIG. 13, the value "03" of identification data $ID_B$ from the block ID detecting circuit 504 and the value "03" of the memory offset OFF held in the offset detecting circuit 507 are added by the adding circuit 506, and the result "06" of such addition is loaded into the counter 503 and the inputted seventh synchronization input data DT7 are written in memory 502 at an address designated by the memory address $ADR_{ROW}$ having the value "06".

The next three synchronization block input data DT which are inputted successively are seen to have identification data $ID_B$ with the values "04", "05" and "06" but are synchronization block input data DT which, as can be seen from the mark "■" in FIG. 13, cannot be corrected to eliminate an error due to a cause other than the identification data $ID_B$.

Accordingly, the counter 503 successively counts up from the value "06" previously loaded therein from the adding circuit 506, and the inputted three synchronization block input data DT are successively written at addresses having the values "07", "08" and "09" of the memory address $ADR_{ROW}$ obtained by such counting up operation.

The processing described above is repeated to write are supplied synchronization block input data DT successively at addresses of the memory corresponding to a value of the memory address $ADR_{ROW}$. When synchronization block input data DT in which the identification data $ID_B$ have the value "FD" are inputted, the memory address $ADR_{ROW}$ supplied from the counter 503 by way of the adding circuit 506 now exhibits the value "00" obtained by addition of the value "03" of the memory offset OFF to the value "FD" of the identification data $ID_B$. The memory address $ADR_{ROW}$ thereby completes its cycle of operation.

In the above described example, the synchronization block input data DT1 are written at the memory address designated by the value "00" of the memory address $ADR_{ROW}$. However, the first synchronization block input data DT necessary for the outer code error detecting and correcting circuit 29 are written at the address of the value "03" defined by the memory address $ADR_{ROW}$ as represented by the value "03" of the memory offset OFF and, accordingly, it is determined that synchronization block input data DT at any address preceding the address of the value "03" need not be transmitted to the outer code error detecting and correcting circuit 29.

Accordingly, synchronization block input data DT, in which the identification data $ID_B$ have the value "FD", are over written at the address having the value "00" of the memory address $ADR_{ROW}$, and synchronization block input data which are inputted successively thereafter, and in which the identification data $ID_B$ have the values "FE" and "FF" are also overwritten at the addresses of the values "01" and "02" of the memory address $ADR_{ROW}$ respectively.

It is to be noted that the last address detecting circuit 508 then detects that the memory address $ADR_{ROW}$ outputted from the counter 503 is equal to the value "02" obtained by addition of the value "03" of the memory offset OFF to the value "FF", and the circuit 508 supplies a memory signal $C_{MEM}$ to control the memory 502 for establishing a write disabled condition so that writing of succeeding synchronization block input data DT into the memory 502 may be inhibited.

In the error correcting circuit 50, not only synchronization block input data which are free of error or can be corrected to eliminate error, but also synchronization block input data which cannot be corrected to eliminate error are written into the memory 502 in response to the memory address $ADR_{ROW}$ from the counter 503. By reason of the foregoing, even if error correction is impossible because of an error which takes place at a portion other than synchronization block data $DT_{BLK}$, correct synchronization block data $DT_{BLK}$ can be transmitted to the outer code error detecting and correcting circuit 29.

When the outer code error detecting and correcting circuit 29 reads the memory 502 in which synchronization block input data DT for one sector SEC are written in the manner as described above, 128 bytes are read, as a series of outer codes, from each of the columns represented by the memory address $ADR_{ROW}$ values "05", "07", . . . , "FD", "FF", . . . , "01" starting with the synchronization block data $DT_{BLK}$ written at an address of the second memory MEM20 designated by the memory address $ADR_{ROW}$ "03" received from the offset detecting circuit 507. Then, 128 bytes are successively read from each of the columns of the first memory MEM10 in a similar manner beginning with an address of the value "04" obtained by the addition of the value "01" to the value "03" of the memory offset OFF.

It will be appreciated that, in the arrangement described above, synchronization block input data DT from the inner code error detecting and correcting circuit 26 are written, whether or not they have an error, into the memory 502 in response to a memory address $ADR_{ROW}$ from the counter 503, and synchronization block input data DT at the top of each sector SEC are detected and held as a memory offset OFF in accordance with identification data $ID_B$ of synchronization block input data DT which are free of error or can be corrected to eliminate error, whereupon, the memory 502 is read out in an order providing a series of outer codes in response to the memory offset OFF by the outer code error detecting and correcting circuit 29. Consequently, as earlier noted, correct synchronization block data $DT_{BLK}$, not only of synchronization block input data DT which are free of error or can be corrected to eliminate error, but also of synchronization block input data DT for which error correction is impossible because of an error which takes place at a portion other than the synchronization block data $DT_{BLK}$, can be sent to the outer code error detecting and correcting circuit 29. Accordingly, the error correcting circuit 50 can have significantly improved error detection accuracy and error correcting ability.

Figure 14:
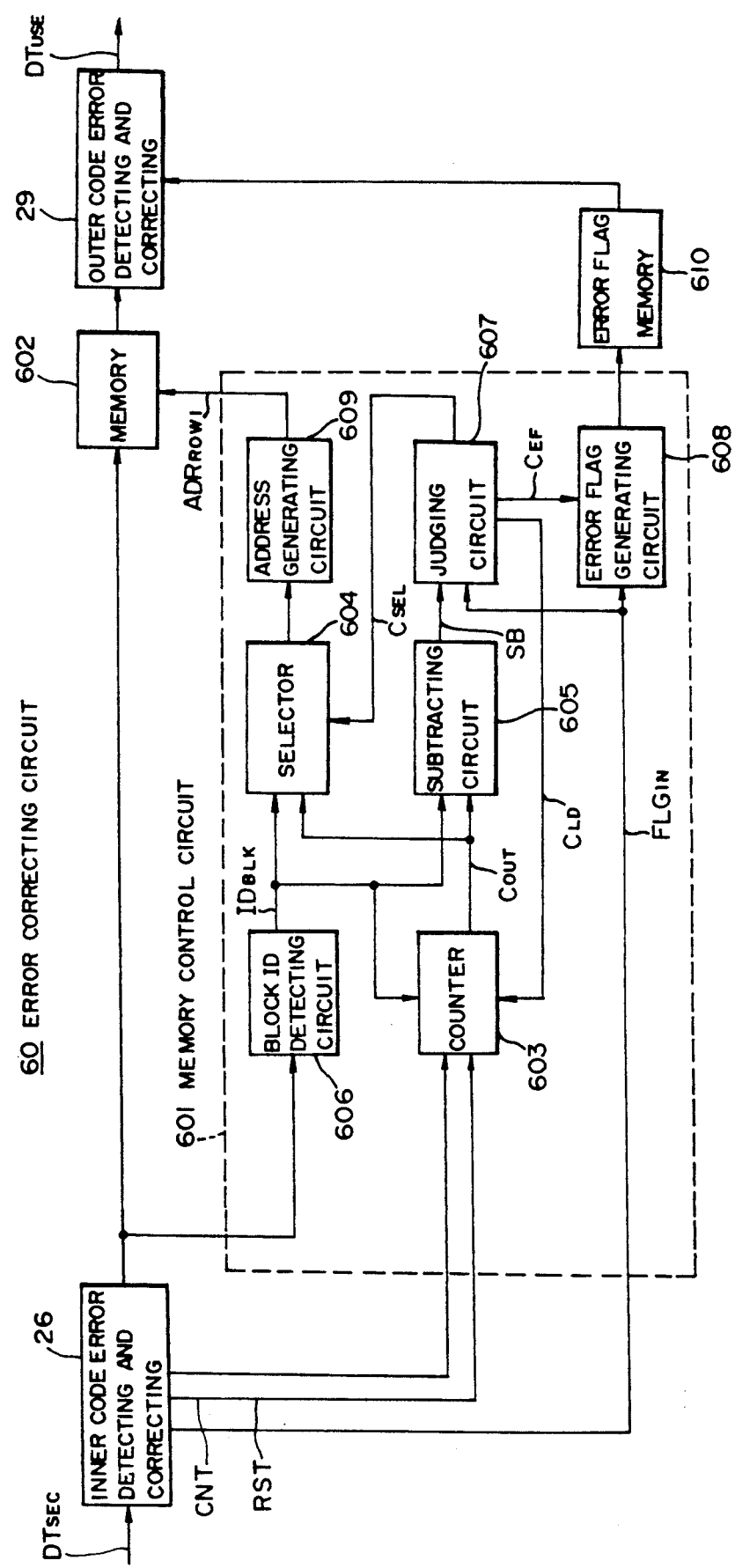
FIG. 14 is a block diagram of another error correcting circuit in accordance with another embodiment of the present invention.

Referring now to FIG. 14, it will be seen that an error correcting circuit 60 according to another embodiment of the present invention includes, similarly to the reproducing system 20 of the magnetic recording and reproducing device shown in FIG. 8, an inner code error detecting and correcting circuit 26 which successively executes error detection and correction using an inner code for each of synchronization blocks $BLK_0$ to $BLK_{255}$ of demodulated reproduction data $DT_{SEC}$ for one section SEC and writes identification data $ID_B$, synchronization block data $DT_{BLK}$ and a parity code RO, all obtained by such error detection and correction, into a memory 602 in the form of a RAM (random access memory) having a construction similar to that of the conventional memory 28 described hereinabove.

Meanwhile, an outer code error detecting and correcting circuit 29 is constructed so that it successively reads the 128 bytes in each of the columns of the memory 602 and then executes error detecting and correcting by means of an outer code with reference to an inner code error flag $FLG_{IN}$ so that information data $DT_{USE}$ recorded on a magnetic tape 15 may be reproduced.

The memory control circuit 601 includes an 8-bit counter 603 which is reset to a value "0" in response to a reset signal RST appearing at a time when sector identification data $ID_{SEC1}$ are detected by the inner code error detecting and correcting circuit 26.

The counter 603 is of the cyclic type which executes a counting up operation successively from a count value "0" to a count value "255" in response to a count pulse CNT received from the inner code error detecting and correcting circuit 26 each time a synchronization block $BLK_0$ to $BLK_{255}$ is inputted but which returns to the value "0" when an overflow takes place. A count output $C_{OUT}$ of the counter 603 is sent to a selector 604 and a subtracting circuit 605.

Further, in the memory control circuit 601, data for one synchronization block BLK from the inner code error detecting and correcting circuit 26 are successively inputted to a block ID detecting circuit 606.

The block ID detecting circuit 606 detects identification data $ID_B$ of a synchronization block BLK which is free of error or in which an error has been corrected while referring to the inner code error flag $FLG_{IN}$ in the synchronization block BLK, and sends the thus detected identification data $ID_B$ to the selector 604 and subtracting circuit 605.

The identification data $ID_B$ are incremented for each of the successive synchronization blocks BLK which are free of error or have been corrected to eliminate an error similarly to the count output $C_{OUT}$ sent out from the counter 603.

The memory 602 includes a pair of memories MEM10 and MEM20 (refer to FIG. 13) each having a capacity of 154×128 bytes in rows and columns, respectively, similarly to the memories MEM1 and MEM2 described hereinabove with reference to FIG. 5 so that identification data $ID_B$, synchronization block data $DT_{BLK}$ and parity codes RO of one synchronization block BLK inputted from the inner code error detecting and correcting circuit 26 may be stored therein in each row.

The subtracting circuit 605 subtracts the count output $C_{OUT}$ from identification data $ID_B$ inputted thereto and supplies the resulting difference value SB to a succeeding judging circuit 607.

It is to be noted that an inner code error flag $FLG_{IN}$ sent out from the inner code error detecting and correcting circuit 26 is inputted to the judging circuit 607 as well as to an error flag generating circuit 608.

Thus, if the judging circuit 607 checks the inner code error flag $FLG_{IN}$ and detects that a synchronization block BLK is free of error or has been corrected to eliminate an error, then it judges, relative to a negative value N and a positive value M set in advance therein, whether or not the difference value SB satisfies the following expression:

$$N \leq SB \leq M \tag{1}$$

If the expression (1) above is satisfied, then the judging circuit 607 sends out a selector control signal $C_{SEL}$ to the selector 604 to select identification data $ID_B$.

Consequently, identification data $ID_B$ are supplied from block ID detecting circuit 606 to an address generating circuit 609 by way of the selector 604, and the identification data $ID_B$, synchronization block data $DT_{BLK}$ and a parity code RO for one synchronization block BLK are written into a row of the memory 602 corresponding to a memory address $ADR_{ROW}$ generated by the address generating circuit 609 in response to the identification data $ID_B$.

It is to be noted that the judging circuit 607 generates a counter control signal $C_{LD}$ to load into the counter 603 value of the identification data $ID_B$ then being judged so that the counting operation of the counter 603 will proceed from such identification data $ID^8$ as a starting or preset value.

In addition, the judging circuit 607 generates an error flag control signal $C_{EF}$ which is supplied to the error flag error flag $FLG_{IN}$ passes through the circuit 608 and is written as it is into an error flag memory 610.

On the other hand, when it is judged that the expression (1) is not satisfied, the judging circuit 607 sends out a selector control signal $C_{SEL}$ to the selector 604 to select the count output $C_{OUT}$ from the counter 603.

Consequently, the count output $C_{OUT}$ is supplied to the address generating circuit 609 by way of the selector 604, and identification data $.IDI_B$, synchronization block data $DT_{BLK}$ and a parity code RO for one synchronization block BLK are written into a row of the memory 602 corresponding to a memory address $ADR_{ROW1}$ generated by the address generating circuit 609 in response to the count output $C_{OUT}$.

It is to be noted that, when the expression (1) is not satisfied, the judging circuit 607 also sends out an error flag control signal $C_{EF}$ to the error flag generating circuit 608 in response to which a latter sets an inner code error flag $FLG_{IN}$. Consequently, even when an inner code error flag $FLG_{IN}$ should have been set, but is not, an error flag $FLG_{IN}$ is written into the error flag memory 610.

On the other hand, in the event that identification data $ID_B$, synchronization block data $DT_{BLK}$ and a parity code RO for one synchronization block BLK inputted from the inner code error detecting and correcting circuit 26 cannot be corrected to eliminate an error, the judging circuit 607 sends out a selector control signal $C_{SEL}$ to the selector 604 to select the count output $C_{OUT}$.

Consequently, the count output $C_{OUT}$ is sent out to the address generating circuit 609 by way of the selector 604, and identification data $ID_B$, synchronization block data $DT_{BLK}$ and a parity code RO for one synchronization block BLK are written into a row of the memory in the direction of rows corresponding to a memory address $ADR_{ROW1}$ generated by the address generating circuit 609 in response to the count output $C_{OUT}$.

Further, the judging circuit 607 sends out an error flag control signal $C_{EF}$ to the error flag generating circuit 608 to pass therethrough an inputted inner code error flag $FLG_{IN}$ from the circuit 26. Consequently, the inner code error flag $FLG_{IN}$ is written as it is into the error flag memory 610.

Identification data $ID_B$ or successively inputted synchronization blocks BLK originally have a continuity, and when synchronization blocks BLK which are free from an error or can be corrected to eliminate an error are inputted successively, the value of identification data $ID_B$ sent out from the block ID detecting circuit 606 is always equal to the value of the count output $C_{OUT}$ sent out from the counter 603.

Accordingly, the difference value SB sent out from the subtracting circuit 605 should normally be equal to "0". However, if the difference value SB is not equal to "0", then it is assumed that identification data $ID_B$ of synchronization blocks BLK have been made discontinuous by some cause.

Thus, in the case of the present embodiment, it is judged by the judging circuit 607 whether or not the expression (1) is satisfied in order to judge the correctness of the synchronization block BLK. If it is judged that the synchronization block BLK is correct, identification data $ID_B$ and synchronization block data $DT_{BLK}$ for the one synchronization block BLK are written into a memory address $ADR_{ROW1}$ determined from the identification data $ID_B$ of the synchronization block BLK.

On the contrary, if it is judged that the synchronization block BLK is not correct, identification data $ID_B$ and synchronization block data $DT_{BLK}$ for the one synchronization block BLK are written into a memory address $ADR_{ROW1}$ determined from the count output $C_{OUT}$ for the counter 603 from the reason that the count value $C_{OUT}$ is continuous from the identification data $ID_B$ of a correct identification block BLK which has been inputted prior to the incorrect synchronization block BLK.

Further, since it is judged that the synchronization block BLK is not correct, the inner code error detecting flag $FLG_{IN}$ for the synchronization block BLK is set as an error and written into the error flag memory 610.

In addition, in case the expression (1) is satisfied, that is, in case it is judged that the synchronization block BLK is correct, the judging circuit 607 loads a value of the identification data $ID_b$ then obtained into the counter 603 so that the values of the count output $C_{OUT}$ and identification data $ID_B$ may coincide with each other.

On the contrary, in case it is not judged that the synchronization block BLK is correct, or in case the inner code error detecting flag $FLG_{IN}$ indicates that error correction is impossible, the count output $C_{OUT}$ of the counter 603 is incremented successively.

According to the construction described so far, the continuity of identification data $ID_B$ of synchronization blocks BLK inputted from the inner code error detecting and correcting circuit 26 is monitored, and it is judged whether or not the synchronization block BLK is a correct synchronization block BLK in controlling a write address of the memory 602 and the inner code error detecting flag $FLG_{IN}$. Consequently, with the error detecting circuit 60, even if an error in detection takes place at the inner code error detecting and correcting circuit 26 due to some cause, error correction can be achieved by the outer code error detecting and correcting circuit 29 with a simple construction.

It is to noted that, while the error correcting circuits 50 and 60 are described separately from each other in order to make clear their respective operation, it is practical to use the error correcting circuits 50 and 60 in a suitable combination with each other.

Further, while in the embodiments described above a memory is provided which includes two memory portions for therein respective storing halves of the synchronization blocks for one sector in accordance with decentralized processing of a recording system, effects similar to those described above can be achieved even with a single memory for storing all of the synchronization blocks for one sector therein.

Although in the embodiments described above a memory address is obtained from a count output of an 8-bit cyclic counter, the a counter for providing a memory address may be of a different type compatible with the type of memory that is employed.

In addition, while the present invention has been described above as applied to magnetic recording device of the ID-1 format, the invention is not thus limited and can be applied suitably to various information transmission systems wherein an error detection code of the product sign format is applied to information data.

What is claimed is:

1. In an information transmission system for coding n-bit information data in the form of an NRZL code into m-bit coded data such that each of said information data corresponds to only one of said coded data which are all different from one another, n being greater than 2 and m being greater than n, NRZI converting said m-bit coded data such that m-bit coded data having a codeword digital sum (CDS) which does not have the same polarity as a digital sum variation (DSV) of previously NRZI converted m-bit coded data is selected as a next NRZI conversion input to limit the DSV of the NRZI converted signal, and transmitting the thus NRZI converted coded data, the combination of:

first controlling means for generating a control signal to control NRZI conversion of said m-bit coded data and for generating a mode signal;

code generating means for generating identification data having a predetermined data pattern corresponding to said n-bit information data and for outputting said identification data and said m-bit coded data obtained by coding of said n-bit information data in response to said mode signal and a coding control signal;

CDS generating means for generating a CDS corresponding to said identification data and m-bit coded data output by said code generating means in response to said mode signal and the coding control signal;

NRZI converting means responsive to said control signal from said first controlling means for outputting the identification data obtained from said code generating means as they are without NRZI converting the same and for executing NRZI conversion of said m-bit coded data outputted from said code generating means using an initial value determined by a conversion initial value signal;

latching means for latching the last bit of the identification data outputted from said NRZI converting means and providing the latched bit as said conversion initial value signal;

DSV detecting means for detecting a current DSV corresponding to an output signal of said NRZI converting means in response to said conversion initial value signal and a DSV immediately preceding said current DSV; and second controlling means for generating said coding control signal in response to said control signal from said first controlling means, said identification data and m-bit coded data output from said CDS generating means, said conversion initial value signal and the detected current DSV from said DSV detecting means to limit the DSV of the output signal of said NRZI converting means.

2. An information transmission system according to claim 1, wherein said code generating means includes a ROM in which said m-bit boded data and identification data are stored and from which the coded data and identification data are outputted when respective addresses are designated by said input information data, said mode signal and said coding control signal.

3. An information transmission system according to claim 1, wherein said CDS generating means includes a ROM in which said m-bit coded data and a CDS corresponding to said identification data are stored and from which the CDS is outputted when a respective address is designated by said input information data, said mode signal and said coding control signal.

4. An information transmission system according to claim 1, wherein said NRZI converting means includes means for NRZI converting said m-bit coded data in a parallel state, and parallel to serial converting means for converting an output of said means for NRZI converting into a serial signal.

5. An information transmission system according to claim 4, wherein said means for NRZI converting includes a ROM in which are stored NRZI converted data corresponding to said m-bit coded data and from which NRZI converted data is outputted when an respective address is designated by said m-bit- coded data from said code converting means and said conversion initial value signal, and the output of said ROM is converted into a serial signal by said parallel to serial converting means.

6. An information transmission system according to claim 4, wherein said means for NRZI converting includes m- exclusive OR circuits and a D flipflop, each of the m bits of said m-bit coded data being inputted to one of a pair of input terminals of a respective one of said exclusive OR circuits, an output signal of each one of said exclusive OR circuits being inputted to the other input terminal of a next one of said exclusive OR circuits except that the one of said exclusive OR circuits to which the least significant bit of said m-bit coded data is inputted has, as its input to the other input terminal thereof an output signal of that one of said exclusive OR circuits to which the most significant bit of said m-bit coded data is supplied through said D flipflop, whereby a signal in a parallel state obtained by NRZI conversion of the m-bit coded data is outputted from said m exclusive OR circuits and then is converted into a serial state by said parallel to serial converting means.

7. An information transmission system according to claim 1, wherein said DSV detecting means includes calculating means for adding or subtracting an output of said CDS generating means to or from, respectively, the immediately preceding DSV of said NRZI converted m-bit coded signal in response to the conversion initial value signal, and storage means for temporarily storing an output of said calculating means therein.

8. An information transmission system according to claim 7, wherein said CDS and said DSV are of opposite polarity and only the most significant bit of an output of said calculating means of said DSV detecting means is used as DSV data.

9. An information transmission system for converting coded data in the form of an NRZL code into an NRZI code and transmitting the NRZI code together with identification data included in a predetermined data pattern, comprising:

NRZI converting means for NRZI converting said coded data but outputting the identification data without NRZI conversion; and latch means for latching the last bit of said identification data of an output of said NRZI converting means, and said NRZI converting means NRZI converting said coded data using output data of said latch means as an initial value.

10. An information transmission system according to claim 9, wherein said coded data inputted to said NRZI converting means has an m-bit parallel arrangement, and said NRZI converting means NRZI converts said coded data of m-bit parallel arrangement in a parallel state.

11. An information transmission system according to claim 10, wherein said NRZI converting means includes a ROM from which a signal of parallel arrangement obtained by NRZI conversion of said coded data is outputted when an address is designated by said coded data and output data of said latch means.

12. An information transmission system according to claim 10, wherein said NRZI converting means includes a number of exclusive OR circuits equal to the bit number m of said m-bit coded data and a D flipflop, each of the m bits of said m-bit code data being inputted to one of a pair of input terminals of a respective one of said exclusive OR circuits while an output signal of each adjacent one of said exclusive OR circuits is inputted to the other input terminal of each of said exclusive OR circuits except that the one of said exclusive OR circuits to which the least significant bit of said m-bit coded data are inputteds has, as it input to the other input terminal, an output signal of that one of said exclusive OR circuits to which the most significant bit of said m-bit coded data is inputted by way of said D flipflop, whereby a signal in a parallel state obtained by NRZI conversion of the m-bit coded data is outputted from said m exclusive OR circuits.

13. An information transmission system according to claim 10, wherein said NRZI converting means includes parallel to serial converting means for converting NRZI converted data of a parallel arrangement into data of a serial arrangement.

14. An information recording device for converting coded data in the form of an NRZL code into NRZI coded data and recording the NRZI coded data together with identification data included in a predetermined data pattern, comprising:

NRZI converting means for NRZI converting said coded data while outputting the identification data without NRZI conversion thereof;

latch means for latching a last bit of said identification data in an output of said NRZI converting means;

said NRZI converting means NRZI converting said coded data using output data of said latch means as an initial value; and means for recording an output signal of said NRZI converting means on a record medium.

15. An information recording device according to claim 14, wherein said coded data inputted to said NRZI converting means has an m-bit parallel arrangement, and said NRZI converting means NRZI converts the coded data of said m-bit parallel arrangement while in a parallel state.

16. An information recording device according to claim 15, wherein said NRZI converting means includes a ROM from which a signal having a parallel arrangement and which is obtained by NRZI conversion of said coded data is outputted when an address thereof is designated by said coded data and output data from said latch means.

17. An information recording device according to claim 15, wherein said NRZI converting means includes a number of exclusive OR circuits equal to the bit number m of said m-bit coded data and a D flipflop, each of the m bits of said m-bit coded data being inputted to one of a pair of input terminals of a respective one of said exclusive OR circuits while an output signal from an adjacent one of said exclusive OR circuits, to which a lower adjacent bit of said m-bit coded data is inputted, is supplied to the other input terminal of each of said exclusive OR circuits, except that the one of said exclusive OR circuits to which the least significant bit of said m-bit coded data is supplied, has, as its input to the other input terminal, an output signal from that one of said exclusive OR circuits to which the most significant bit of said m-bit is inputted, supplied by way of said D flipflop, whereby a signal in a parallel state obtained by NRZI conversion of said m-bit coded data is outputted from said m exclusive OR circuits.

18. An information recording device according to claim 15, wherein said NRZI converting means includes parallel to serial converting means for converting NRZI converted data having a parallel arrangement into data having a serial arrangement.

19. An information data recording and reproducing device for adding an error correction code of the product sign format to input information data to form coded data, NRZI converting the coded data, recording the NRZI converted coded data together with predetermined data including identification data on a record medium, and performing error detection and correction of reproduction data obtained from such record medium to reproduce data recorded on the record medium, comprising:

NRZI converting means for outputting the identification data without NRZI conversion thereof while NRZI converting the coded data, said NRZI converting means further including a latch means for latching the last bit of the identification data outputted from said NRZI converting means said NRZI converting means using output data of said latch means as an initial value in said NRZI converting of said coded data;

inner code error detecting and correcting means for detecting an inner code error of said transmission data, correcting the thus detected inner code error and outputting inner code correction data in a predetermined block data unit;

memory means for storing said inner code correction data therein;

counting means for counting said inner code correction data for each said block of data as a unit;

identification data detecting means for detecting identification data of each said block of data of the inner code correction data which is free of error or which has been corrected to eliminate error;

offset detecting means for detecting an offset amount between output data of said counting means and output data of said identification data detecting means and providing corresponding offset data;

adding means for adding the output data of said identification data detecting means and output data of said offset detecting means and providing an added output which presets said counting means;

monitoring means for monitoring continuity of said block data on the basis of output data of said counting means and output data of said identification data detecting means as well as an error flag generated by said inner code error detecting and correcting means, and for judging from said monitoring whether or not the block data are correct block data and providing a corresponding selecting signal;

data selecting means for selecting either the output data of said counting means or the output data of said identification data detecting means as an output signal in response to said selecting signal of said monitoring means;

address generating means for generating address data identifying addresses at which said inner code correction data are to be written in said memory means in response to the output data from said data selecting means; and outer code error detecting and correcting means for reading out data stored in said memory means in accordance with a series of outer codes in accordance with said offset data from said offset detecting means, detecting an outer code error of the data thus read out and correcting the outer code error thus detected.

* * * * *